(12) United States Patent
Fujikawa et al.

(10) Patent No.: US 6,733,592 B2
(45) Date of Patent: *May 11, 2004

(54) HIGH-TEMPERATURE AND HIGH-PRESSURE TREATMENT DEVICE

(75) Inventors: Takao Fujikawa, Takasago (JP); Yoichi Inoue, Takasago (JP); Yutaka Narukawa, Takasago (JP); Takahiko Ishii, Takasago (JP); Tsuneharu Masuda, Takasago (JP); Makoto Kadoguchi, Takasago (JP); Yoshihiko Sakashita, Takasago (JP)

(73) Assignee: Kobe Steel, Ltd., Kobe (JP)

( * ) Notice: Subject to any disclaimer, the term of this patent is extended or adjusted under 35 U.S.C. 154(b) by 87 days.

This patent is subject to a terminal disclaimer.

(21) Appl. No.: 10/142,990

(22) Filed: May 13, 2002

(65) Prior Publication Data

US 2002/0129901 A1 Sep. 19, 2002

Related U.S. Application Data

(63) Continuation of application No. 09/527,520, filed on Mar. 16, 2000, now abandoned.

(30) Foreign Application Priority Data

Mar. 17, 1999 (JP) .......................................... 11-072115
Nov. 5, 1999 (JP) .......................................... 11-315646

(51) Int. Cl.$^7$ ............................................. C23C 16/00
(52) U.S. Cl. ...................... 118/715; 118/719; 118/724; 118/725; 156/345.52; 414/935

(58) Field of Search .......................... 118/715, 724–726, 118/719; 414/935–941; 432/5, 6, 247, 253, 241; 156/345.29, 345.31, 345.52, 345.33

(56) References Cited

U.S. PATENT DOCUMENTS

| | | | | | |
|---|---|---|---|---|---|
| 4,699,084 A | * | 10/1987 | Wilson et al. | ............... | 118/725 |
| 5,266,118 A | * | 11/1993 | Mitra | .......................... | 118/726 |
| 5,798,126 A | * | 8/1998 | Fujikawa et al. | .............. | 425/78 |
| 6,285,010 B1 | * | 9/2001 | Fujikawa et al. | ............ | 219/411 |
| 6,328,560 B1 | * | 12/2001 | Fujikawa et al. | ........... | 432/205 |
| 6,455,446 B2 | * | 9/2002 | Narukawa et al. | .......... | 438/795 |
| 6,491,518 B1 | * | 12/2002 | Fujikawa et al. | ...... | 156/345.31 |
| 2002/0129901 A1 | * | 9/2002 | Fujikawa et al. | ...... | 156/345.31 |

\* cited by examiner

Primary Examiner—Jeffrie R. Lund
(74) Attorney, Agent, or Firm—Oblon, Spivak, McClelland, Maier & Neustadt, P.C.

(57) ABSTRACT

The present invention has an object to obtain a small-size, high-temperature and high-pressure treatment device adapted to treat semiconductor wafers. The high-temperature and high-pressure device of the invention is intended to treat semiconductor wafers in an atmosphere of high-temperature and high-pressure gas, and comprises a pressure vessel having at a lower portion thereof an opening for putting the semiconductor wafers in and out, a lower lid disposed so as to be vertically movable for opening and closing the lower opening, wafer transfer means for stacking and unstacking the semiconductor wafers onto and from the lower lid, and a heater attached to the lower lid for heating the semiconductor wafers.

6 Claims, 15 Drawing Sheets

INCREASE IN NOMINAL HEAT CONDUCTIVITY BY NATURAL CONVENTION

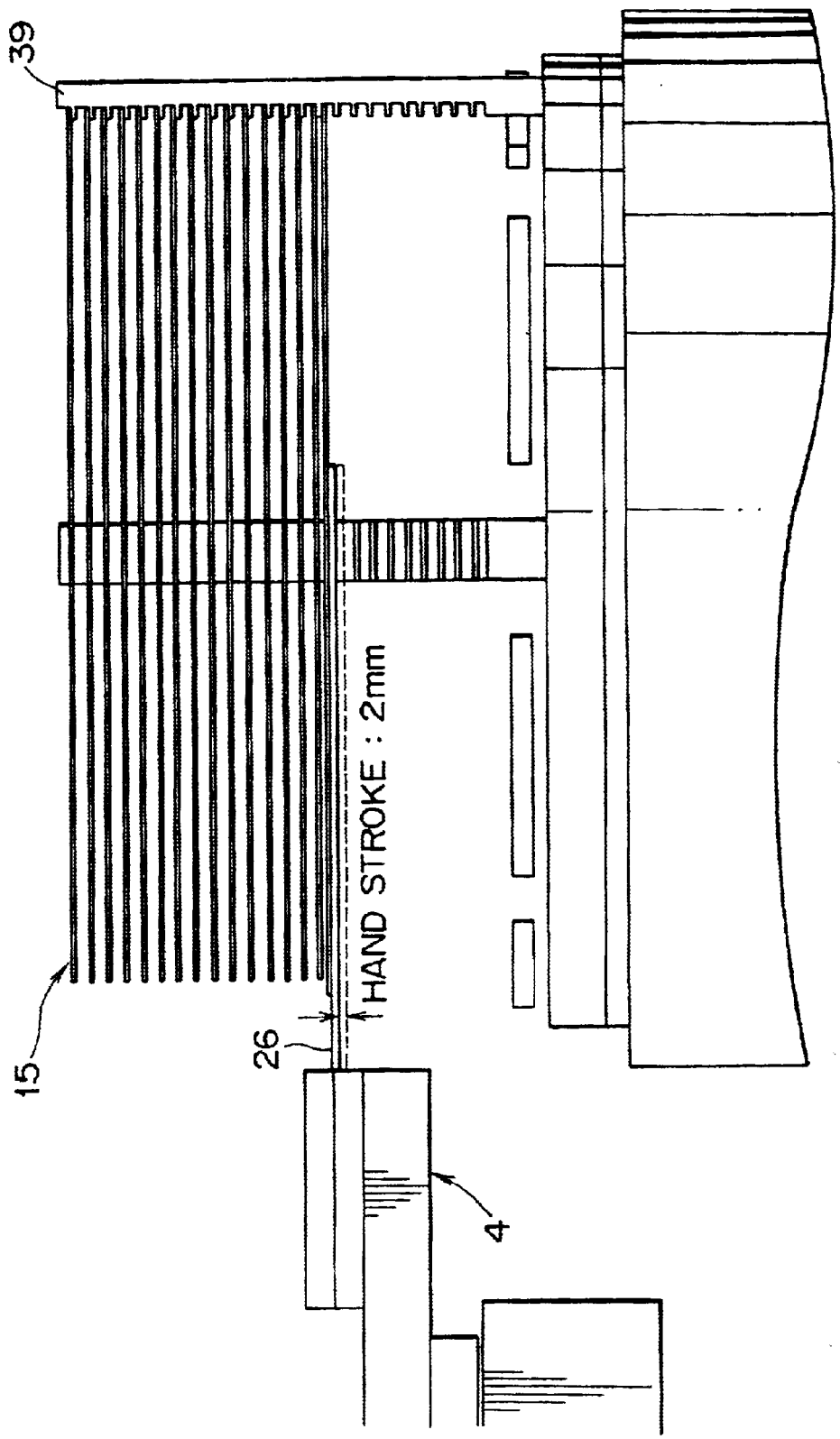

HIGH-TEMPERATURE AND HIGH-PRESSURE TREATMENT DEVICE

The present application is a continuation of application Ser. No. 09/527,520, filed on Mar. 16, 2000, and now abandoned.

BACKGROUND OF THE INVENTION

1. Field of the Invention

The present invention relates to a device for treating ULSI semiconductors represented by Si wafers in a high-temperature, high-pressure atmosphere. More particularly, the invention relates to a device used for a treatment for eliminating pores mainly by means of inert gas pressure, such as a so-called pressure filling method (high-pressure reflow process) for wiring films by which wafers having wiring films formed therein are treated using inert gas pressure.

2. Description of the Related Art

One example of a known semiconductor wafer fabrication process including a high-pressure gas treatment is a so-called pressure filling method for wiring films (high-pressure reflow processes; disclosed in Japanese Unexamined Laid-Open Applications Nos. 2-205678, 3-225829, and 7-193063) in which wafers having aluminum alloy wiring films formed therein by a PVD method are treated using inert gas pressure.

Further, an example of a known semiconductor processing technique using a gas whose pressure is as high as several tens atm is a high-pressure oxidation process in which a dielectric layer is formed by oxidizing the surface of a Si wafer. Since this treatment is intended for oxidation, oxygen or water is inevitably mixed into a pressure medium.

It is known that the former process uses a so-called single wafer processing cluster tool type device by which semiconductor wafers are subjected to a PVD treatment and then to a high-pressure treatment one by one. As disclosed in Japanese Unexamined Patent Laid-Open Application No. 7-193063 (see FIG. 6 in the said publication), this device treats wafers by sequentially transferring the wafers in a lock chamber to a series of treating modules disposed around a core chamber using a transfer arm inside the core chamber. A high-pressure module directly installed to the core chamber has been proposed as one of the modules (Prior art 1). An example of a more detailed structure of this high-pressure module has also been proposed by the same applicant in Japanese Unexamined Patent Laid-Open Application No. 7-502376 (Prior art 2).

It is also known that the latter process, particularly a process performed in an atmosphere of high-pressure gas using a vertical boat (wafer stacking jig), employs a device such as disclosed in Japanese Unexamined Patent Laid-Open Application No. 4-234119 (Prior art 3).

This device, although completely different from the device of the present invention in its application, is indicated as the prior art for reference because its construction is similar to that of the device of the invention. Prior art 3 is "a device for treating semiconductor wafers characterized by comprising: a pressure vessel; a hollow body having a treatment chamber within the pressure vessel, the hollow body having a lower opening for receiving a plurality of wafers when the plurality of wafers are moved as a group from a position in a lower region of the pressure vessel to a position within the treatment chamber; operating means movable perpendicularly to the pressure vessel for closing the opening; means for introducing a high-pressure inert gas into the pressure vessel; means for beating an oxidizing agent within the treatment chamber; means for cooling the hollow body after the wafers have been processed within the treatment chamber; and means, coupled with the pressure vessel and the hollow body for equalizing the pressure of the inert gas and that of the oxidizing agent and coupled with a main body for equalizing the pressure of the inert gas and that of the oxidizing agent, for substantially separating the insert gas from the oxidizing agent." The wafers, which are the products to be treated, are treated while stored in a vertical boat that can stack several tens to one hundred and several tens of wafers thereon.

In the single wafer type devices, such as Prior arts 1 and 2, whose treatment mode is different from that of a so-called batch type device according to the present invention, problems inherent in their processing mode are more serious than drawbacks attributable to their structure.

That is, to meet the requirement that the cycle time of the single wafer processing be substantially equal to that of the concurrently performed PVD treatment, a short-cycle operation must be repeated more than tens of thousands of times per month.

In such a heavy-duty operation, various parts and components including the seal structure, seal material and the like of the opening and closing part of the vessel are used under so severe conditions that it would be quite difficult for these devices to secure safety and treatment reliability.

Especially, taking the pressure filling method for wiring films as an example, it is difficult to design a single wafer treatment device having a satisfactory life standing up to 1,000,000 or more operations for the following reasons. In the pressure filling method for wiring films, copper films are replacing conventional Al films in recent years, and the pressure filling method for these copper films require a high pressure of 100 MPa or more, or even 150 MPa at low temperatures of 350–400° C. Due to such a high pressure involved in the process, it is difficult to design a single wafer treatment device with a satisfactory life.

Further, the high-pressure oxidation device such as Prior art 3 is operated with an inert gas unless an oxidizing agent is introduced. Since the device of this type is originally intended to perform an oxidation treatment, no considerations are given to air that inevitably enters into the high-pressure vessel when objects to be treated are put in and out of the vessel. That is, no such considerations are given at all since unlike the pressure filling method having to cope with the oxidation problem of wafers, the oxidation treatment requires no measures to prevent possible mixture of oxygen, i.e., mixture of oxygen accompanied by mixture of air. Therefore, this device addresses problems when operated in an almost inert atmosphere, especially in an oxygen-free atmosphere.

Under such prior art situation, a recent tendency is that wafers not only have larger diameter from 8 to 12 inches, but also are managed in a smaller lot size. In a standard fabrication process for 8 inches wafers, twenty-five wafers are stored in a single cassette, and product quality control is carried out on a lot basis, the size of a lot being 25, 50, or 100 wafers, i.e., multiples of 25.

However, the minimum lot size of twenty-five wafers is likely to change to, for example, thirteen as the wafer diameter increases to 12 inches. Particularly, the lot size will probably be decreased for the production of semiconductors applied to logic parts that are to be fabricated in small quantities and in various types. Under such circumstances, it is most likely that a device capable of flexibly accommodating various production quantities with a minimum lot size will dominate the future design of a fabrication device.

The above-mentioned single wafer treatment devices (Prior arts 1 and 2) could respond to this requirement. However, their structure of being integrated with a film-forming device used in the preceding step of sputtering rather imposes difficulty when they need to be operated with other film-forming methods, e.g., a plating method in combination.

To meet such needs, it is preferable to use a device or system capable not only of operating independently of the preceding and succeeding steps but also of treatment efficiently a small lot of one to ten or so wafers in accordance with the production quantity. However, such a device or system has not yet been proposed.

On the other hand, due to the fact that the formation of oxide films by oxidation is time-dependent, the oxidation treatment device such as shown as Prior art 3 inevitably requires much time for processing even a small lot of wafers. Thus, the device of this type has many problems to be overcome.

For treatment not so time-restricted as above, a device or system capable of processing a small lot of wafers quickly while maintaining a certain level of productivity can be constructed. It is known that a high-temperature and high-pressure treatment, such as the pressure filling method for wiring films, is less restrictive in terms of time.

Therefore, a device or system for such a high-temperature and high-pressure process must also meet the requirement for the small-lot processing. In this case, it is important to give a solution to the problem of how a minimum-sized device can handle wafers in what lot size. That is, the heart of the problem is how a device of small treatment capacity can treat a maximum number of wafers.

SUMMARY OF THE INVENTION

The present invention has been made in view of the above circumstances, and an object of the invention is therefore to provide a high-temperature and high-pressure treatment device for semiconductor wafers adapted for treating a comparatively small lot of wafers based on the fact that a high-temperature and high-pressure gas is subjected to natural convection quite easily and its temperature also tends to be easily homogenized.

The present invention further proposes a device for treating semiconductor wafers in a high-temperature and high-pressure inert atmosphere on a batch basis with about one to twenty-five wafers per batch. More particularly, the invention allows high-pressure treating to be effected with a high productivity while solving technical problems inherent in producing semiconductors, such as contamination of semiconductor wafers by particles and the like caused, for example, during the treatment step.

The present invention provides the following technical means in order to achieve the above objects.

That is, according to one aspect of the present invention, there is provided a high-temperature and high-pressure treatment device which is intended to treat semiconductor wafers in an atmosphere of high-temperature and high-pressure gas, and which includes: a pressure vessel having at a lower portion thereof an opening for putting the semiconductor wafers in and out; a lower lid disposed so as to be vertically movable for opening and closing the lower opening; wafer transfer means for stacking and unstacking the semiconductor wafers onto and from the lower lid; and a heater attached to the lower lid for heating the semiconductor wafers.

In a high-temperature and high-pressure treatment device, the heater could be disposed so as to surround the semiconductor wafers, which are the products to be treated, within the pressure vessel. Particularly, in the case where vertically stacked wafers are treated on a batch basis, it would generally be considered preferable to arrange the heater in that way in order to achieve a uniform temperature distribution in each wafer. However, such heater arrangement causes the pressure vessel to have a larger diameter.

The inventors have found that a non-uniform temperature distribution is hard to occur when a high-pressure gas is used because of its natural convection. Paying attention to this fact, the inventors decided to arrange the heater on the lower lid for the present invention.

That is, the fact that the heater is arranged on the lower lid means that the heater is located in a lower region of the pressure vessel. The heater so located causes an upflow due to its heat, and such an upflow together with violent natural convection currents of the high-pressure gas make the temperature within the pressure vessel substantially uniform. This heater arrangement of the present invention is particularly effective for a comparatively small lot production, and it also prevents the pressure vessel from having a larger diameter and thus contributes to downsizing the device.

Further, according to the invention, the lower lid is movable downward, and so is the heater that is disposed thereon, and thus the heater can be detachably arranged in and out of the pressure vessel. That is, by lowering the lower lid, the heater can be taken out of the pressure vessel together with the lower lid, and thus its maintenance becomes easier than a heater being fixed inside the pressure vessel.

Note that the heater may be disposed directly on the lower lid or indirectly through other members.

It is preferable that the heater have a substantially disc-like general form and be comprised of a plurality of radially split heating elements that can be controlled independently of each other.

Since this heater design allows the temperature distribution to be controlled in the radial direction, a further uniform temperature distribution can be achieved.

It is also preferable that: the pressure vessel have in an upper portion thereof a high-pressure gas introducing passage for introducing a high-pressure gas into a treatment chamber provided therein and a high-pressure gas discharging passage for discharging the high-pressure gas from the treatment chamber; the pressure vessel have therewithin a treatment chamber forming member for defining part of a space thereof as the treatment chamber for the semiconductor wafers; the gas introducing passage be formed so as to reach an inner surface of the treatment chamber forming member so that the gas can be supplied directly to an upper region of the treatment chamber; and the treatment chamber forming member have an opening at a lower portion thereof so that the gas discharged from the lower opening reaches the high-pressure gas discharging passage while passing through a space outside the treatment chamber forming member.

It is still further preferable that the lower lid has an independent gas discharging passage which opens to release the gas and particles within the pressure vessel while the pressure vessel is under low pressure or being evacuated.

It is still further preferable that the gas introducing passage have a stop valve for controlling gas flow and that a filter for entrapping particles be disposed downstream of the stop valve.

According to another aspect of the present invention, there is provided a high-temperature and high-pressure treatment device, which is intended to treat semiconductor wafers in an atmosphere of high-temperature and high-pressure gas and which includes: a pressure vessel; a treatment chamber for treating a plurality of stacked semiconductor wafers within the pressure vessel; a heater disposed within the treatment chamber so as to be located under the plurality of stacked semiconductor wafers; and a convection current passage forming member for forming a first passage and a second passage within the treatment chamber, the first passage having the semiconductor wafers therewithin and passing an upflow resulting from heating by the heater, the second passage communicating with the first passage at upper and lower regions of the treatment chamber and causing circulating convection currents to be formed between the first passage and itself by a downflow passing therethrough.

In the above construction, the heater is located under the semiconductor wafers, and such a construction prevents the pressure vessel from having a larger diameter compared with the case where the heater is disposed beside the semiconductor wafers.

Further, the convection current forming member is disposed in this construction in order to improve temperature uniformity within the treatment chamber. Therefore, the first passage causes an upflow due to the heat from the heater, and such an upflow enters into the second passage and becomes a downflow going down into the lower region of the treatment chamber and returning to the first passage, thereby forming in circulating convection currents throughout the first and second passages. Such circulating convection contributes to further improving temperature uniformity within the treatment chamber.

Further, it is preferable that temperature measuring means be disposed at the first passage.

Although a substantially uniform heat distribution can be achieved in a regular high-temperature and high-pressure operation, e.g., under a pressure as high as 20 MPa or more, it is still important to monitor the temperature throughout the whole operation in order to guarantee a specified temperature history of the semiconductor wafers. Further, there may be a case where large power must be supplied to the heater for an operation requiring heating at the time of low pressure. In such a case, to prevent overheating of the heater, it is recommended that a separate temperature measuring means be arranged near the heater so that temperatures near the heater can be monitored.

It is also preferable that the convection current passage forming member be a soaking cylindrical member which has openings at upper and lower portions thereof and which is disposed so as to surround the plurality of stacked semiconductor wafers, and that a space inside the cylindrical member serve as the first passage and a space outside the cylindrical member serve as the second passage.

In this case, due to heat from the heater, an upflow is caused within the soaking cylindrical member, and due to the upper and lower openings of the cylindrical member, a downflow is caused outside the cylindrical member. As a result, circulating convection currents are formed inside and outside the cylindrical member. Such circulating convection ensures a uniform heat distribution within the treatment chamber.

It is further preferable, in this case, that a shielding member be disposed between the cylindrical member and the lower inner surface of the pressure vessel. This arrangement prevents particles staying on the lower inner surface of the pressure vessel from entering into the passage.

According to still another aspect of the present invention, there is provided a high-temperature and high-pressure treatment device, which is intended to treat semiconductor wafers in an atmosphere of high-temperature and high-pressure gas and which includes: a pressure vessel; a treatment chamber for treating a plurality of stacked semiconductor wafers within the pressure vessel; a heater disposed within the treatment chamber so as to be located under the plurality of stacked semiconductor wafers; an airtight casing constructed so as to enclose the heater; a first gas passage formed within the airtight casing so that spaces inside and outside the airtight casing communicate with each other; and a filter deposed on the first gas passage for entrapping particles.

While various factors are responsible for the formation of particles within the pressure vessel, the heater is the most responsible one.

According to this construction, the heater that produces particles is enclosed in the casing, whereby the particles formed in the heater are prevented from contaminating the semiconductors.

Further, this device is a high-pressure device designed to be used under, for example, a maximum pressure of so high as 200 MPa, and the airtight casing, if not provided with a passage for communicating with the outside, will be broken due to pressure differences in and out. Thus, the first gas passage is provided in the airtight casing lest the casing should break. Further, the filter is also disposed in the casing lest particles should move together with the gas flowing in and out of the casing. Therefore, this arrangement of the present invention prevents breakage of the airtight casing while preventing contamination of the wafers within the pressure vessel.

It is preferable that the device comprise a second gas passage formed in the airtight casing so that spaces inside and outside the airtight casing communicate with each other, and that the second gas passage have a reverse flow preventing device allowing the gas to flow only into the airtight casing from outside.

With this arrangement, the gas enters into the casing mainly via the second gas passage, and exits from the casing mainly via the first gas passage. That is, the first gas passage, due to its having the filter disposed for entrapping particles, has a high air-flow resistance, and thus if only the first gas passage were provided, it would take much time for the gas to enter into the casing. However, since the second gas passage with no filter is disposed, the gas can enter the casing more quickly.

Additionally, the second gas passage has the reverse flow preventing device, and thus particles and the gas do not exit from the casing via the second gas passage. The gas flows out through the filter of the first gas passage, thereby preventing particles from going out of the casing. Moreover, since the gas passing through the filter flows only in the direction of going out of the casing, the gas is less likely to scatter the particles around.

It is also preferable that the airtight casing have a coupling opening to be coupled with an inner surface of the pressure vessel and the coupling opening be coupled with the inner surface of the pressure vessel so as to close the coupling opening substantially airtightly, and that an electric cable for supplying electricity to the heater from outside the pressure vessel be disposed so that the cable reaches the heater within the airtight casing while being extended by a distance allowing the inner surface of the pressure vessel to close the coupling opening.

According to this construction, the heater is enclosed by both the airtight casing and the inner surface of the pressure vessel. Further, the electrical cable is extended to the heater within the casing directly from the inner surface of the pressure vessel, and thus there is no need to pass the cable through the casing wall. Still further, the resultant simple structure ensures easy maintenance. It is also quite important that a semiconductor fabrication device implement quick maintenance.

BRIEF DESCRIPTION OF THE DRAWINGS

FIG. 12 is a diagram showing how wafers are stacked;

DETAILED DESCRIPTION OF THE INVENTION

Embodiments of the present invention will hereinafter be described with reference to the drawings.

Figure 1:
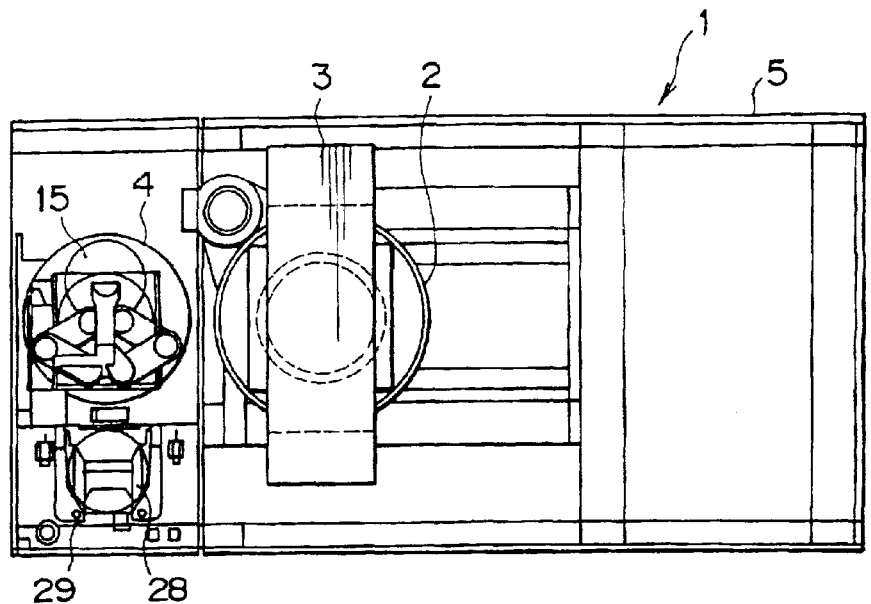
FIG. 1 is a plan view of a high-temperature and high-pressure treatment device according to a first embodiment, in which a high-pressure vessel is supported by a press frame.
Figure 2:
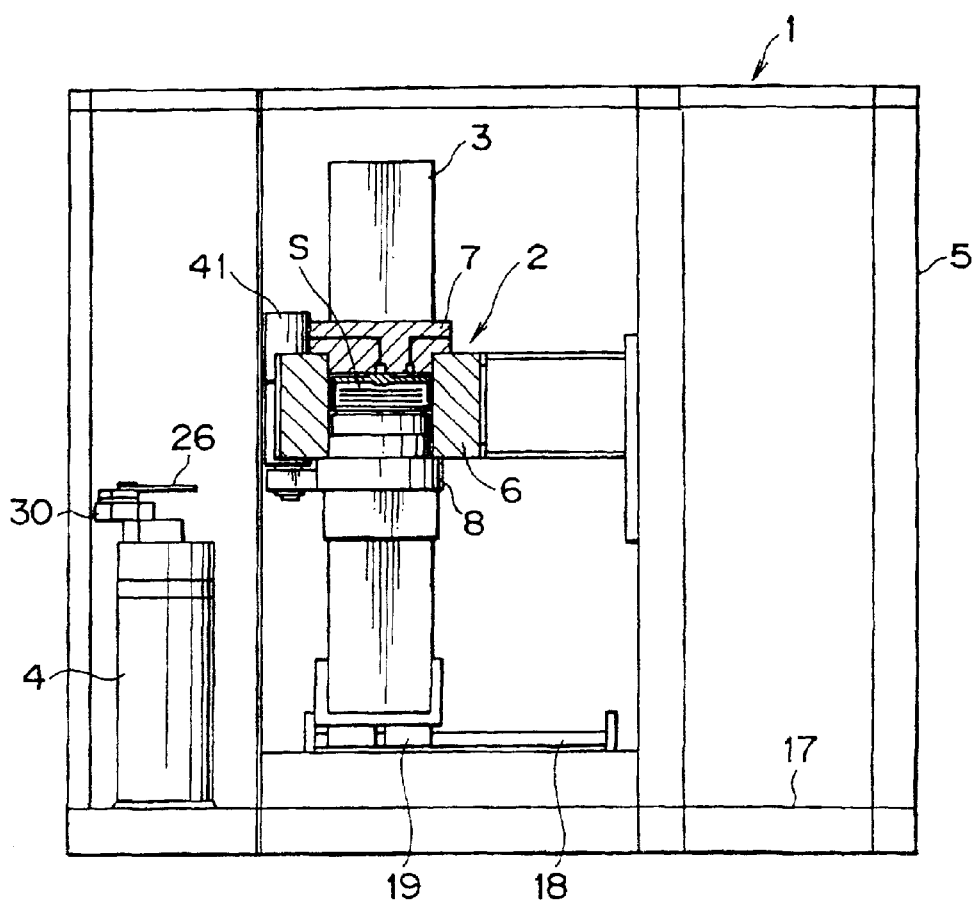
FIG. 2 is a front view of FIG. 1.

FIGS. 1 and 2 show an example of a main body of a high-temperature and high-pressure treatment device 1 for semiconductors according to the present invention. These figures show particularly a state in which the device 1 is operated under high pressure with a high-pressure vessel (pressure vessel) 2 filled with high-pressure gas.

The main body comprises the high-pressure vessel 2 including a press frame 3, a wafer transferring robot (transfer means) 4, and a housing 5 for accommodating all these members.

Figure 5:
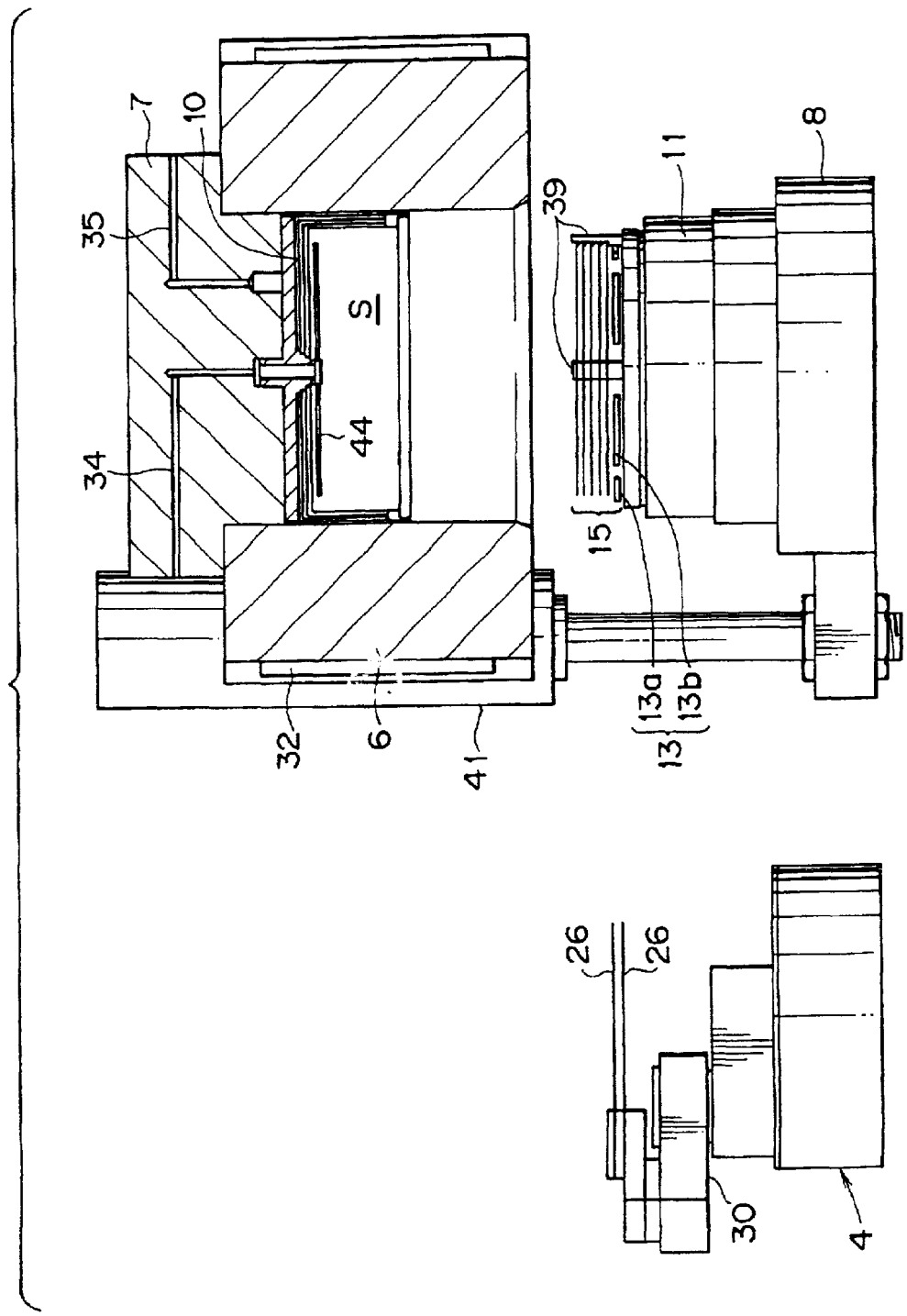
FIG. 5 is an enlarged front view of the treatment device.

As shown also in FIG. 5, the pressure vessel 2 includes a high-pressure cylinder 6 having openings at both top and bottom ends thereof, an upper lid 7, a lower lid 8, and the press frame 3 for supporting axial loads applied to the upper and lower lids 7 and 8. A heat insulating layer (heat-insulating structure) 10 is incorporated into a space S defined by the upper lid 7 and the cylinder 6. The heat-insulating layer 10 serves also as a treatment chamber forming member that defines a treatment chamber for treating semiconductor wafers 15. A heater 13 placed right on an insulating member 12 is disposed above the lower lid 8 through a metallic shield block 11. The block 11 contains therein a heat-shielding plate, the electrodes, etc. of the heater and the like. The heater 13 is radially divided into two zones (heating elements 13a and 13b), and is located not only within the treatment chamber but also under the wafers 15 that are stacked above the lower lid 8. Note that the heater 13 is of resistance heating type.

Figure 3:
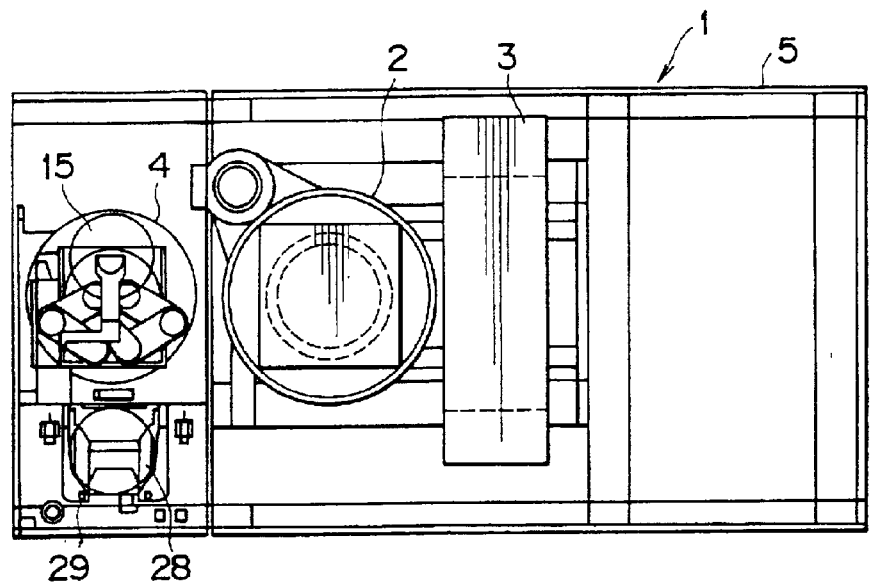
FIG. 3 is a plan view of the treatment device with a lower lid descended.
Figure 4:
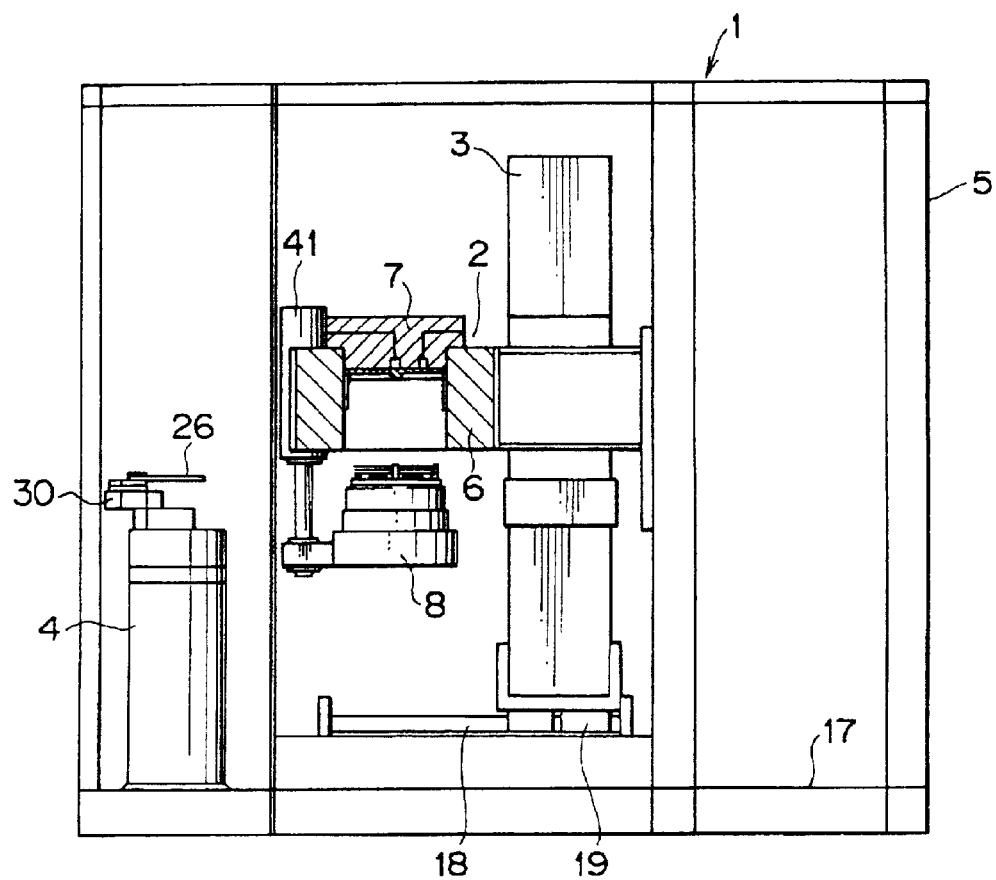
FIG. 4 is a front view of FIG. 3.

To get the semiconductor wafers 15, i.e., the products to be treated, in and out of the pressure vessel 2, the press frame 3 is moved sideward by causing a slide block 19 fixed at the bottom thereof to slide along rails 18 installed on a base frame 17, and then the lower lid 8 is moved downward by a lower lid 8 elevating actuator. This state is shown in FIGS. 3 and 4.

A wafer handling robot 4, disposed on the side opposite to the direction of movement of the press frame 3, holds the semiconductor wafers 15 by first extending its hand 26 toward the upper surface of the lower lid 8 and then receiving the exposed wafers 15 from below. The wafers thus held by the robot hand 26 are then recovered while transferred to a wafer cassette 28 on a wafer elevator by driving the robot 4. To load the device 1 with the wafers 15, the above procedure is followed in reverse order.

The wafer handling robot 4 shown in FIGS. 1 to 4 is of such type that its arm 30 is horizontally rotatable and expandable as well as vertically movable. When the wafer cassette 28 is placed on the cassette elevator as described above, the robot arm 30 should have a vertical stroke of only a few millimeters because its required operation is to merely scoop up or lower down the wafers from and onto the cassette. If the cassette elevator is not used, the robot 4 should have a larger vertical stroke allowing the wafers 15 to be put in and taken out of the cassette 28.

The robot hand 26, disposed on the distal end of the arm 30, is a fork-shaped metal plate composed of, for example, aluminum or ceramic plate composed of, for example, alumina. The hand 26 transfers the wafers while lifting them in such a manner as to scope them up from below. Although two hands 26 are in FIG. 5, there may be only one hand 26, or three or more hands layered at the same pitch as the wafer stacking pitch in order to shorten the stacking time.

FIG. 5 shows the main body of the device 1 in an enlarged form. A water-cooled jacket 32 is attached to the high-pressure cylinder 6 of the pressure vessel 2, so that the jacket 32 drives out of the system the heat supplied by the heater 13 in the pressure vessel 2, and hence the temperature of the vessel 2 can be maintained within the range of room temperature to one hundred and several tens ° C. Since a large volume of heat is accumulated in the upper lid 7 of the vessel 2 for the same reason, it is also recommended that a water-cooled groove or grooves (not shown) be formed in the upper lid 7. A high-pressure gas introducing hole 34 and a high-pressure gas discharging hole 35 are formed in the upper lid 7 of the pressure vessel so as to be independent of each other.

On the lower side of the upper lid 7 is the heat-insulating structure 10 in which a plurality of cup-like metallic members 37 are layered at intervals (its details will be described later).

Further, above the lower lid 8 (on the insulating material) are the heater 13 for heating the semiconductor wafers 15 as mentioned above, a wafer supporting jig (boat) 39 for supporting the wafers 15 in the form of trays, and so on, and the metallic shield block 11 is interposed between the lower lid 8 and the space accommodating these members 13 and 39, so that transmission of heat to the lower lid 8 is suppressed. The block 11 also houses therein the connecting electrodes and the like.

The semiconductor wafers are placed on the wafer supporting jig 39 at a position not interfering with the hand 26 of the robot 4 that moves toward them from the left as viewed in FIG. 5. The jig 39 supports one to twenty-five wafers (five wafers in FIG. 5) at three to four circumferential points. While the number of stacked wafers 15 is five in the example shown in FIG. 5, more wafers may be stacked as long as a soaking zone, which is regulated by the temperature and pressure and the arrangement of the heater 13, is secured satisfactorily in the vertical direction.

The lower lid 8 including the members carried thereon is vertically movable by, for example, an electrically or pneumatically driven lower lid actuator 41. FIG. 5 shows the lower lid 8 set in the position for putting the wafers 15 out or in. To take the wafers 15 out, the arm 30 of the robot 4 on the left expands rightward to cause its hand 26 to get into the bottom of the wafers 15. By elevating the arm with the hand a few millimeters under this condition, the wafers 15 are scooped up with the robot hand 26. Then, the robot arm 30 is moved leftward. When the wafer cassette 28 is in such a position as shown in FIGS. 1 to 4, the wafers 15 are transferred to the cassette 28 by rotating the robot arm 30 by 90 degrees.

Figure 6:
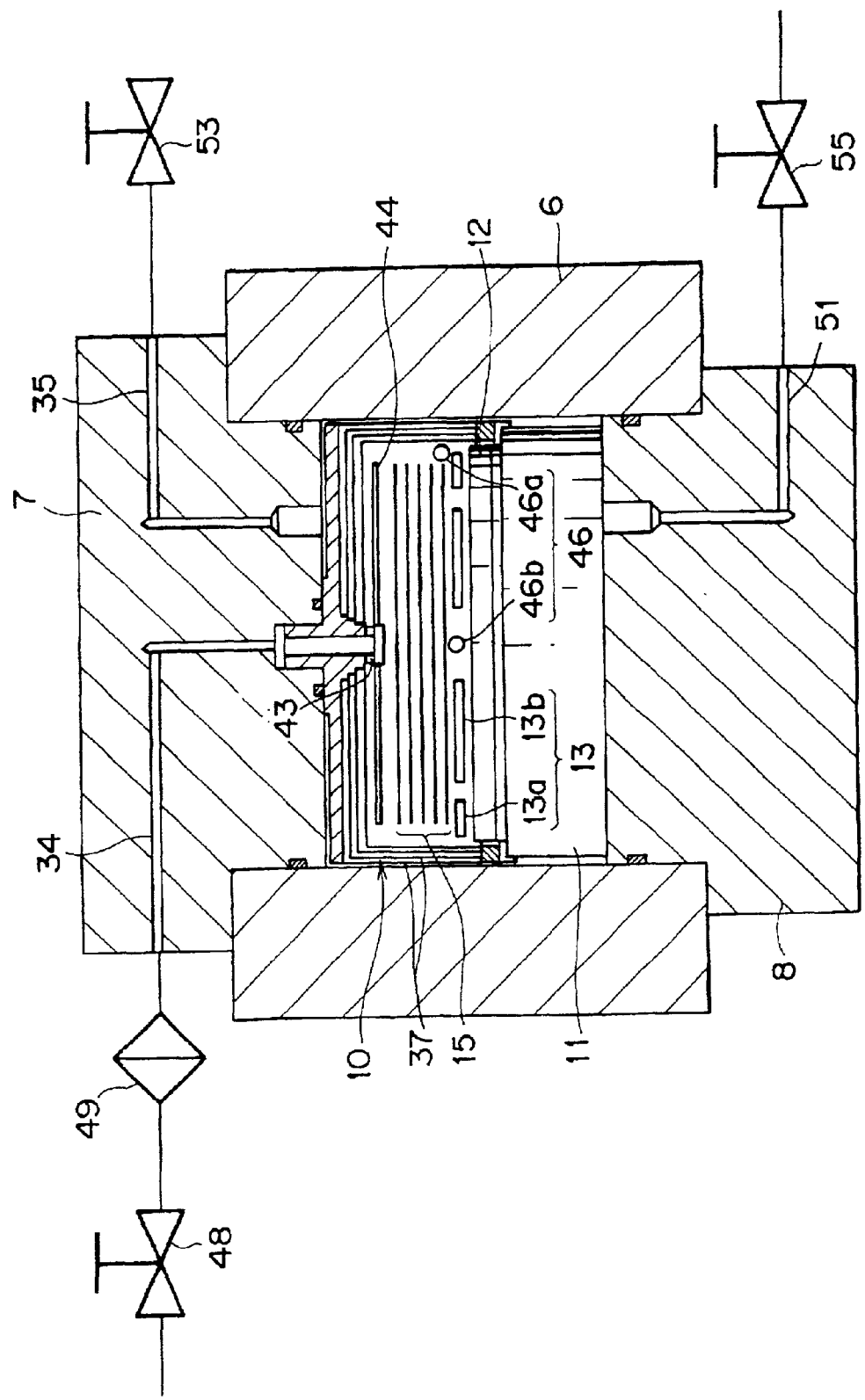
FIG. 6 is a sectional view showing the interior of the high-pressure vessel.

FIG. 6 presents a further detailed internal construction of the main body of the device 1.

The heat-insulating layer 10 has such a structure that a plurality of cup-like metallic members 37 are layered at intervals within the treatment chamber with an opening provided at bottom end thereof, so that heat radiation due to natural convection of a high-pressure gas can be effectively suppressed. Additionally, due to its being made of metal, the layer 10 also can suppress formation of particles.

When argon gas is used as a pressure medium, an effective interval between these metallic members is about 0.5 to 3 mm. In order to suppress heat radiation due to emission as well, it is effective to have three or more members layered. A four-layered structure is shown in FIG. 6. A larger number of layers can better suppress natural convection and emission, while smaller intervals in turn cause the adjacent cup-like metallic members 37 to rub each other due to their differences in thermal expansion, and from this arises the problem of particles.

From this viewpoint, and if the internal temperature is in the range of about 300–500° C., it is practical to have a layer of three to six 0.5–2 mm thick cup-like members 37. Note that the heat-insulating layer 10 is fixed while screwed into, for example, the vessel-side opening of the high-pressure gas introducing passage 34 formed in the upper lid 7.

The high-pressure gas supplied via the high-pressure gas introducing passage 34 is introduced into the treatment chamber space via holes passing through the heat-insulating layer 10. As shown by arrows in FIG. 7, it is preferable that the holes be so constructed as to allow the gas to be blown and diffused horizontally in order to prevent erratic movement of the semiconductor wafers 15 (the dancing of the wafers) during high-speed pressurizing.

Such gas diffusion holes 43 are arranged at three to six circumferential positions. In order to prevent diffusion of gas and non-uniform distribution of temperature, it is also recommended that a gas diffusion plate 44 be interposed between the gas diffusion holes 43 and the wafers 15 within the treatment chamber as shown in FIG. 6. If holes are formed in the gas diffusion plate 44 thicknesswise, the gas flow can be intentionally adjusted.

Figure 7:
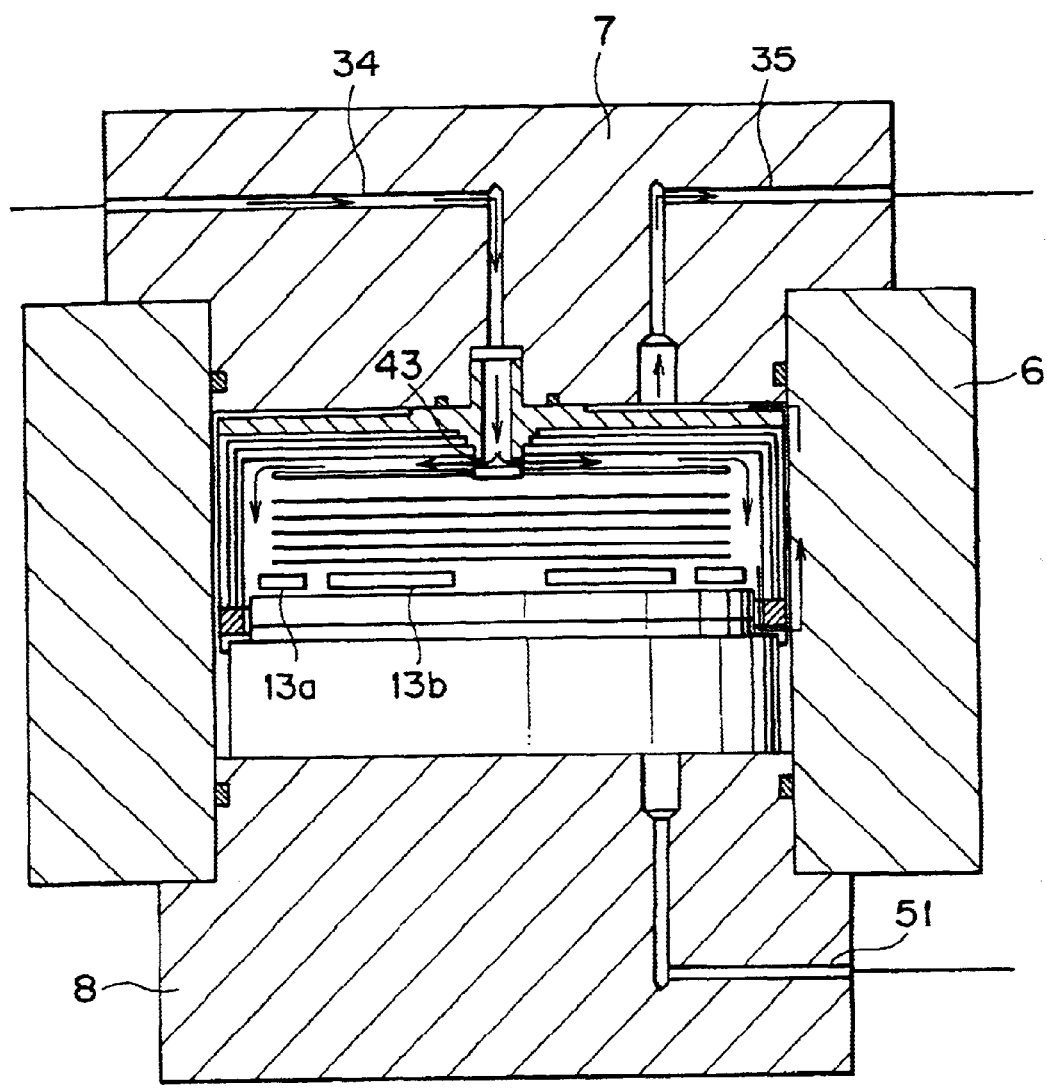
FIG. 7 is a diagram showing the gas flow within the high-pressure vessel.

It is recommended that the heater 13 disposed above the lower lid 8 in a substantially disk-like form be divided into a plurality of zones in the radial direction as shown in FIGS. 5 to 7 so that independent heat control can be effected over the plurality of zones. That is, it is preferable to arrange a plurality of ring-like heating elements 13a and 13b concentrically for the following reasons.

When the wafers 15 are heated with only one heater, a non-uniform temperature distribution inevitably results, with the wafers 15 being at high temperatures at the center and at low temperatures at the outer edge, due to heat radiation from the heater itself. In addition, this non-uniform temperature distribution varies depending on the pressure and temperature conditions.

A practical solution to this problem is to ensure uniform heating in the radial direction by dividing the heater 13 into inner and outer zones, disposing as many temperature measuring means 46 as the number of these zones, and constantly feeding temperatures measured in these zones back to a heating power controller (not shown).

Specifically, the heater 13 in this embodiment comprises a ring-like outer heater 13a, a ring-like inner heater 13b concentrically disposed inside the outer heater 13a, outer temperature measuring means 46a located near the outer heater 13a, and inner temperature measuring means 46b located near the inner heater 13b.

It would be convenient to use thermocouples as the temperature measuring means 46, but other types of temperature measuring means may also be acceptable.

Note that the five wafers 15 shown in FIG. 5 may have a non-uniform temperature distribution in the vertical direction, depending, on the temperature and pressure conditions under which they are treated. To prevent such inconvenience, it is recommended that the uppermost and lowermost of the five wafers 15 be replaced with dummy wafers 15, with only three in the middle being product wafers.

In view of the fact that the lowermost wafer is heated by direct radiation from the heater 13 and the other wafers 15 mainly by natural convection of the high-pressure gas, it is recommended that the lowermost wafer 15 be replaced with a dummy wafer. If the lowermost wafer 15 is a Si wafer that easily transmits infrared rays, the dummy wafer may be prepared by coating the Si wafer with an emission-shielding material. It is also recommended that the uppermost wafer be a dummy in order to prevent its contamination due to particles that are likely to fall down from the pressure vessel 2, for example, when the lower lid is moved vertically.

The pressure operation, i.e., the supply and discharge of a high-pressure gas will be described here with reference to FIGS. 6 and 7. The high-pressure gas, which is a pressure medium, is supplied from a gas compressor (not shown) using a gas cylinder (normally 15 MPa) as a gas source (not shown). In a high-pressure anneal method for preventing formation of pores in wiring films, an inert gas, such as argon gas, having a high treatment pressure of 70–200 MPa is used.

A stop valve 48 is usually arranged between the compressor and the high-pressure gas introducing hole 34 formed in the upper lid 7 of the pressure vessel 2. The valve 48 controls (permits and prohibits) the supply of the gas. Actually, a number of additional stop valves are usually arranged along the passage between the gas source and the pressure vessel.

These stop valves or the gas compressor usually includes sliding parts in which metals or a metal and a seal member rub each other, and particles such as wear particles resulting from the sliding and rubbing cause short-circuiting paths to be formed in a fine interconnection structure during the treating of semiconductor wafers such as Si wafers. Thus, it is requisite to prevent entrance of these particles into the treatment chamber.

In the present invention, a filter 49 is disposed downstream of the stop valve 48, or more specifically, between the gas diffusion holes 43 within the pressure vessel 2 and the stop valve 48, so that the particles formed by the above-mentioned cause are entrapped immediately before the treatment chamber to thereby prevent their entrance into the treatment chamber. A filter 49 capable of entrapping particles of 0.01 µm or more in diameter is usually used for semiconductor fabrication, and such a filter is applied to the present invention. However, to entrap some of wear particles that are as coarse as a few µm or more in diameter, it is recommended to arrange a double filter system consisting of a filter for fine particles and a filter for coarse particles, the latter being disposed on the compressor side of the former. The number of filters may be two or more.

While the filter is located at a position along the line between the upper lid 7 of the pressure vessel and the stop valve 48 in FIG. 6, it may also be incorporated into the entrance of the gas diffusion holes 43, i.e., into the opening of the high-pressure gas introducing passage 34 facing the pressure vessel 2. In this case, it is preferable to locate the fine filter at this position and the coarse filter at a position along the line so as to facilitate maintenance work such as replacement of filter elements.

The flow of the high-pressure gas and the like in the actual treating will hereinafter be described in the order of process steps.

After loading the pressure vessel 2 with the wafers 15, air that has entered the vessel is usually discharged by evacuation from the high-pressure gas discharging passage 35 or a gas discharging passage 51 formed in the lower lid 8 shown in FIG. 6.

Then, a substitution operation in which an inert gas is supplied at a pressure of 1 MPa or lower and discharged is performed repetitively. In this case, the gas is introduced from the high-pressure gas introducing passage 34 and discharged from the high-pressure gas discharging hole 35. Then, the gas is supplied from the high-pressure gas introducing passage 34. At this time, the high-pressure gas is blown horizontally from the gas diffusion holes 43, and the gas diffusion plate 44 guides the thus diffused gas lest a large local stream should be formed within the treatment chamber. At the same time, the heater 13 is energized for heating.

Natural convection resulting from the heating of the high-pressure gas forms a passage that causes the gas to circulate only within the treatment chamber. Once the treatment chamber is kept under predetermined temperature and pressure, the heater 13 is disenergized, and then the gas is released by opening a stop valve 53 disposed at a position along the line connected to the high-pressure gas discharging passage 35.

At this time, the gas within the pressure vessel 2 is, as shown in FIG. 7, guided from the lower opening of the heat-insulating layer 10 to the high-pressure gas discharging passage 35 via the space between the layer 10 and the cylinder 6 and via a gas passage extending over the upper surface of the layer 10.

The gas within the treatment chamber exits from the lower opening of the treatment chamber defining heat-insulating layer 10, flows outside the layer 10 (outside the treatment chamber), and gets into the high-pressure gas discharging passage 35 as described above. That is, the high-pressure gas always flows in one direction, and this prevents the gas from flowing backward toward the semiconductor wafers even if particles are formed. Hence, contamination caused by particles can be prevented.

In the actual treating, particularly the spreading around of particles in the initial evacuation step, in which the chamber is evacuated to a vacuum from a few atmospheres, is a problem. To overcome this problem, it is preferable to dispose a stop valve 55 so that the gas discharging passage 51 provided in the lower lid 8 can be opened only when the treatment chamber is under low pressure and vacuum. With this arrangement, contamination of wafers due to particles can be effectively suppressed.

In industrial-level semiconductor wafer production plants, ten-odd to fifty wafers are treated every hour. The above-described device 1 has a treatment cycle of 20 to 60 minutes when treating wafers at 300–500° C. and 100–200 MPa. A loading rate of twenty-five wafers at a time is substantially equal to a standard industrial production level, but a loading rate of five wafers at a time does not satisfy industrial production requirements. In the latter case, it is recommended to build a system incorporating a plurality of modules 60 and a shared wafer supplying and transferring robot 4 or unit, each module 60 comprising the pressure vessel 2 of the above-described device.

Figure 8:
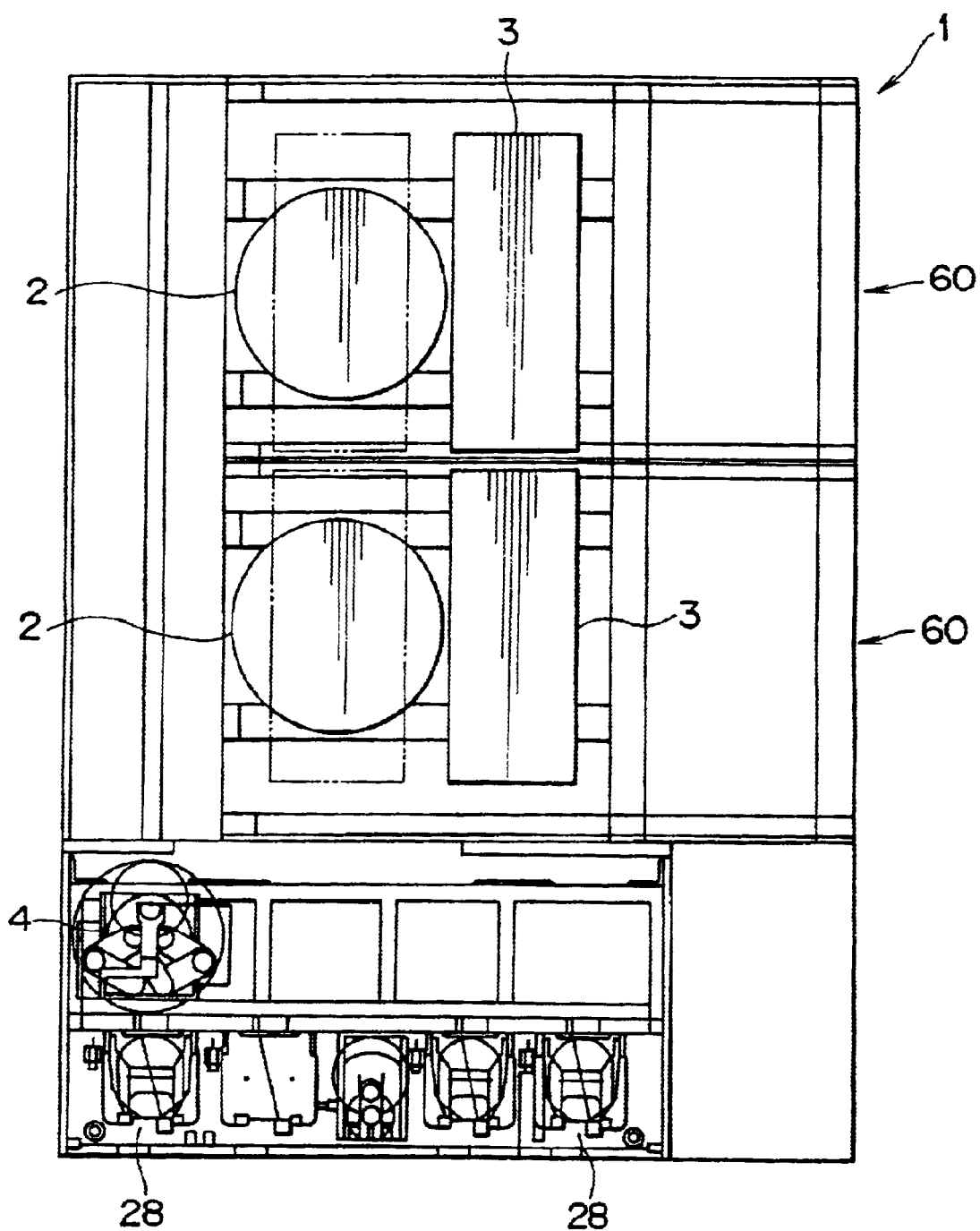
FIG. 8 is a plan view of a systematized treatment device equipped with two high-pressure modules.

FIG. 8 shows an example of a device thus systematized. In this example, two high-pressure modules 60 are combined with a unit that sequentially takes wafers 15 out of four cassettes 28 and transfers them to the high-pressure modules 60. The number of high-pressure modules 60 may be determined in accordance with the required quantity of production.

With such a construction, equipment that is flexibly expandable in accordance with the required production quantity can be installed in a small area. Unlike arranging a number of devices 1 side by side, this construction facilitates cassette handling operation, thereby improving total productivity.

Note that the wafers 15 are exposed to atmosphere when transferred from the cassette 28 to the pressure vessel 2 and vice versa in the device 1 of the invention described above. To prevent wafers from being contaminated by particles during transfer, it is recommended that the wafer transfer passage be enclosed by an airtight casing and that clean air having particles removed by means of a clean filter be introduced into such passage.

In the above-mentioned device 1, the whole structure including the press frame 3 is contained in the housing 5 made from an airtight material as shown in FIGS. 1 to 4. Although not shown, a filter unit for supplying clean air is installed at the ceiling portion above the robot 4 and the cassette elevator, so that the air can flow in one direction from the ceiling toward the press frame 3.

As mentioned above, the present invention makes a significant contribution to overcoming serious problems, such as the formation of particles and the oxidation caused by oxygen in an ambient gas, encountered by a treatment using a high-pressure inert gas, such as the pressure filling method for wiring films whose effectiveness is now attracting attention amidst recent advances in the ULSI technology directed toward further sub 0.1 $\mu$m rule fabrication. Particularly, in terms of its applicability to industrial production, a batch type treatment device using a small robot according to the present invention is highly useful with its readiness for size and weight reduction as well as for systematization that can provide equipment flexibly expandable in accordance with the production quantity.

The present invention can also make a remarkable contribution to the future development of ULSI industrial production, in terms, especially, of wiring film forming treatments, due to its flexible combination with the existing PVD system and its easy safety control and plant management with high-pressure gas facilities collectively housed in a single chamber.

Figure 9:
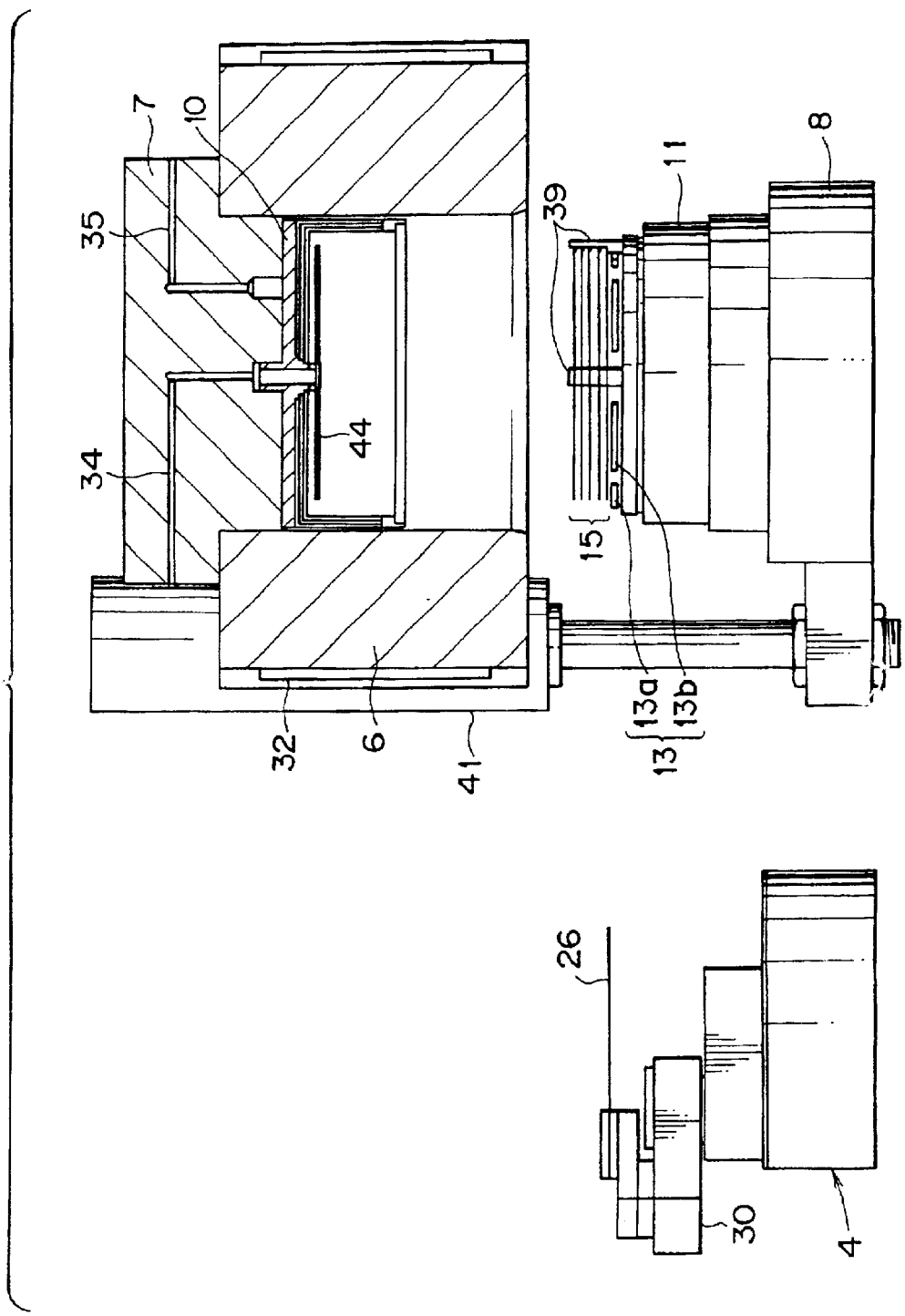
FIG. 9 is an enlarged front view of a high-temperature and high-pressure treatment device in which a robot has only one hand.

Next, the pitch for stacking the wafers 15 on the wafer supporting jig 39 will be mentioned with reference to FIGS. 9 to 12. Note that a device 1 shown in FIG. 9 is identical with that shown in FIG. 5 except that the robot 4 has only one hand 26.

First of all, currently used Si wafers, which are 200 mm in diameter, are stacked on the jig at a pitch of 1/4 inches (6.35 mm).

Such a pitch is required in order to prevent a non-uniform temperature distribution that impairs product quality. That is, in a device that treats wafers under atmospheric pressure by stacking the wafers vertically, such as an oxidation furnace, a diffusion furnace, or a reflow furnace, when the wafers are stacked at too short a pitch in an atmosphere of air or in an inert gas at atmospheric pressure, the air or the inert gas does not transfer heat well between adjacent wafers nor is natural convection hard to occur. Thus, unless a certain pitch is provided between the wafers, a non-uniform temperature distribution occurs, and this makes it hard to keep reliable quality of the wafers.

In addition, the above pitch is required also by the fact that a vertical stroke of about 2 mm is necessary to stack and unstack wafers using the existing wafer transferring robot and that the hand of the wafer handling robot has a thickness of 1.5 to 2 mm.

The inventors carried out experiments of a high-temperature and high-pressure treatment using argon gas of 300–500° C. and 70–200 MPa. The treatment was performed to eliminate pores, which were holes called contact holes present in or under Al and Cu wiring films formed by the PVD method or an electrolytic plating method. From the results of these experiments, the inventors found out that due to a violent natural convection resulting from argon gas under such a high pressure, the temperature distribution became less non-uniform and product quality was unobjectionable even with a shorter pitch.

Figure 10:
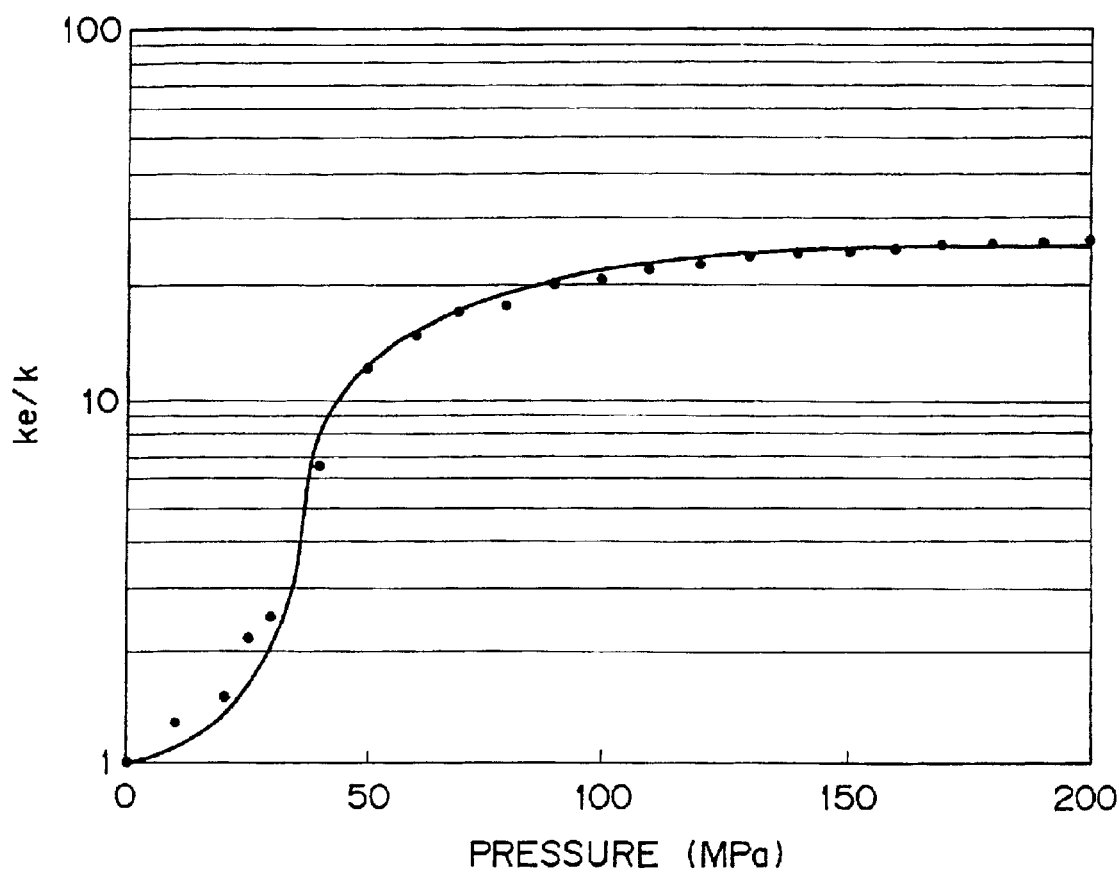
FIG. 10 is a graph showing an increase in nominal heat conduction due to natural convection of a gas.

FIG. 10 semiquantitatively shows how nominal heat conductivity increases due to such natural convection, with the horizontal axis indicating the pressure. The value K of "Ke/K" in the vertical axis of FIG. 10 indicates the heat conductivity of the argon gas and Ke the nominal heat conductivity increased by the natural convection.

An increase in the nominal heat conductivity (Ke/K) depends actually on the dimensions, temperature and the like of the wafers. In the case of argon gas, its nominal heat conductivity generally increases drastically at a pressure of 30 MPa or higher.

Actually, this effect was confirmed by treating wafers and making investigations of their temperature distribution under the following conditions.

When 200-mm-diameter (0.725-mm-thick) Si wafers were spaced at 1 mm (or pitched at 1.725 mm) or more, natural convection occurred quite violently, while when they were spaced at 1.5 mm (or pitched at 2.225 mm), a uniform temperature was achieved over their entire surface (the temperature difference between the center and the outer edge was within 5° C.) even if they were kept under predetermined temperature and pressure (300–500° C. and 100–200 MPa) for only 5 minutes or so.

However, an ordinary robot 4 cannot stack and unstack wafers at such a small interval. In order to overcome this inconvenience, a proper stacking pitch was specified as being 4 to 8 times the thickness t of the wafer 15, and a proper stacking operation was also specified such that wafers are sequentially stacked downward from the uppermost and unstacked upward from the lowermost. This operation prevents the hand 26 of the robot 4 from interfering with wafers at its lower side, and thus permits easy stacking and unstacking operation. This is the reason why the robot 4 of the device 1 shown in FIG. 9 has only one hand 26.

To check the above conditions, an operation was performed by using the 1.75 mm thick hand 26 of an ordinary robot 4 (for 200 mm wafers). That is, when the wafers having a diameter of 200 mm and a thickness of 0.725 mm were pitched at 4 mm, and stacked and unstacked with the robot vertically moving at a regular stroke of 2 mm, nothing objectionable occurred.

FIG. 12 shows a geometric arrangement, etc. in the above operation. It shows a vertical boat that can store twenty-five wafers (pitched at 4 mm). From test results, the wafer stacking pitches, ranging from 2.9 to 5.8 mm (4 to 8 times the wafer thickness), were judged to be unobjectionable. However, a more preferable pitch is in the range of 4 to 7 times the wafer thickness.

Note that the thickness of the robot hand 26 may be reduced to 0.7 to 1 mm when the hand 26 is made from a ceramic that is more rigid and thus less deformable.

In actual treating, the wafer tends to lose its complete flatness more at further subsequent steps after the formation of multilayered wiring films, and it becomes more susceptible to thermal deformations due to increased temperatures during high-temperature and high-pressure treatment. Therefore, taking these facts into consideration, it is recommended that an adequate margin be given in specifying a proper pitch.

Figure 11B:
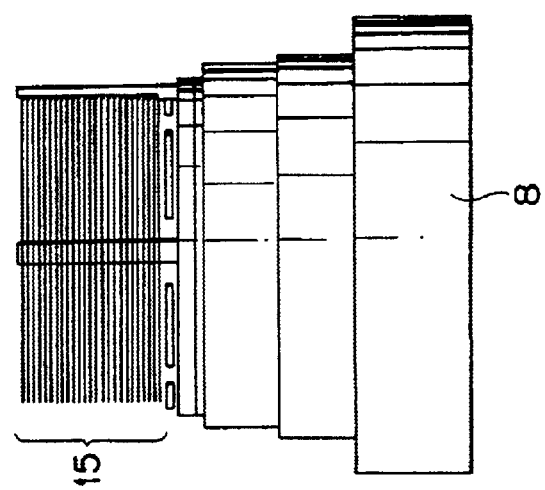
FIGS. 11A and 11B are diagrams showing different stacking heights due to different stacking pitches of wafers, wherein 11A shows an example according to a conventional device, and 11B an example according to a device of the present invention.
Figure 11A:
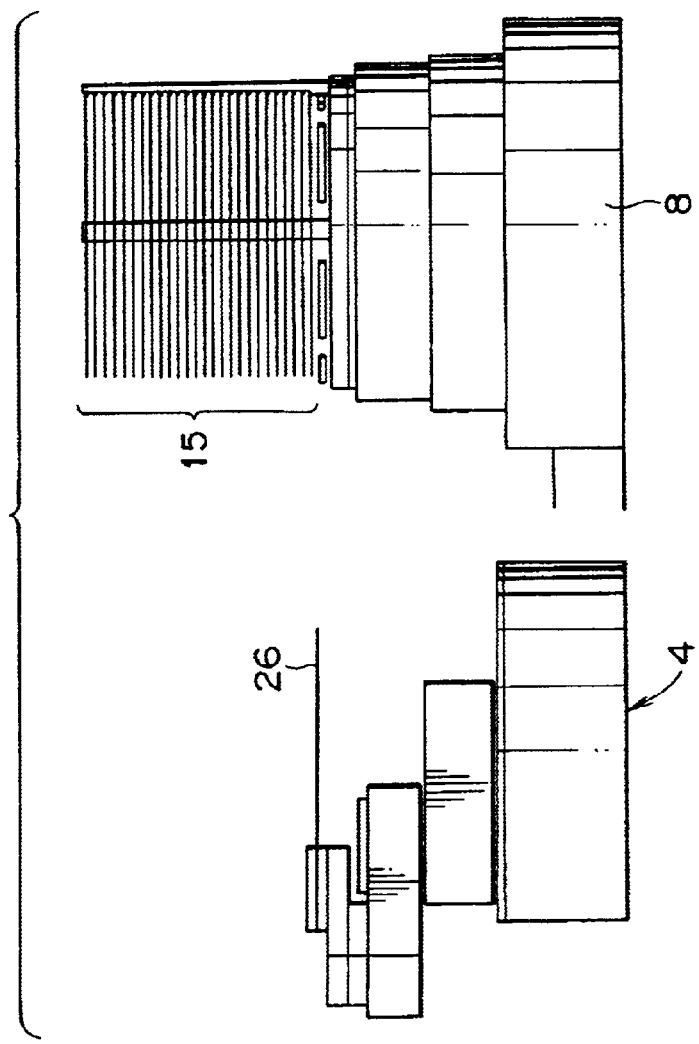

FIGS. 11A and 11B show difference between the stacking height (FIG. 11A) according to a conventional pitch (6.35 mm) and the stacking height (FIG. 11B) with a properly specified pitch of 4 mm inclusive of a margin (about 5.5 times the wafer thickness) according to the present invention when twenty-five 200-mm-diameter wafers were treated. A stacking pitch of 6.35 mm requires a total height of 153 mm, while a stacking pitch of 4 mm according to the invention requires a total height of only 97 mm. This smaller total height according to the invention implies an increase in the treatment capacity of a conventional device from fifteen to twenty-five wafers, which then implies a sharp increase in the productivity (to 1.67 times) with a small-size device.

Figure 13:
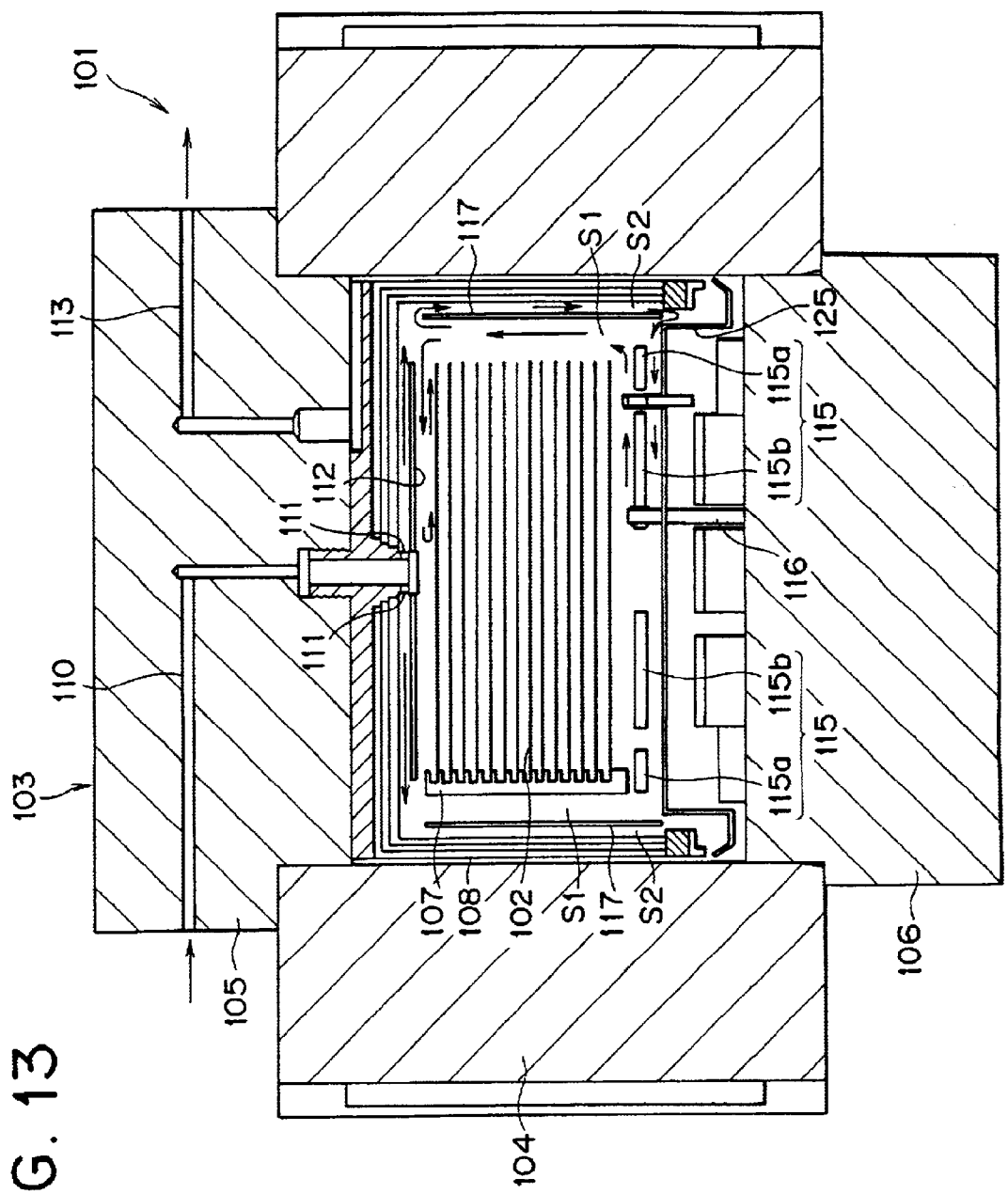
FIG. 13 is a sectional view showing the interior of a high-temperature and high-pressure treatment device according to a second embodiment.

FIG. 13 shows a high-temperature and high-pressure treatment device 101 for semiconductors according to a second embodiment of the present invention. This device 101 also anneals semiconductor (Si) wafers, which are products 102 to be treated, under an atmosphere of high-temperature and high-pressure gas, and has a pressure vessel (high-pressure vessel) 103 for containing the wafers 102.

The pressure vessel 103 includes a cylindrical body 104 having openings at both top and bottom ends thereof, an upper lid 105 for closing the upper opening of the cylindrical body 104, a lower lid 106 for closing the lower opening of the cylindrical body 104.

A jig (boat) 107 disposed relative to the lower lid 106 vertically supports a plurality of wafers 102.

A heat-insulating layer 108 is suspended from the upper lid 105. The heat-insulating layer 108 has such a structure that a plurality of cup-like metallic members are layered at intervals. The wafers 102 are piled up in the form of trays by the jig 107 so as to be covered by the innermost member of the heat insulating layer 108.

The heat-insulating layer 108 is fixed to the upper lid 105 while screwed into the vessel-side opening of a high-pressure gas introducing passage 110.

A high-pressure gas, which is a pressure medium, is supplied by a gas compressor using a gas cylinder as a gas source. In the high-pressure anneal treatment or the like for preventing formation of pores in wiring films, an inert gas such argon gas having a high treatment pressure of 70–200 MPa is used.

The high-pressure gas supplied via the high-pressure gas introducing passage 110 is introduced into a treatment chamber space (inside the heat-insulating layer) via a hole passing through the heat-insulating layer 108. As shown by arrows in FIG. 13, it is preferable that the gas be blown and diffused horizontally from gas diffusion ports 111 for purging the gas in order to prevent erratic movement of the semiconductor wafers 102 (the dancing of the wafers) during high-speed pressurizing.

Note that it is preferable to dispose a gas diffusion plate 112 in such a manner that the plate 112 is spaced from the upper inner surface of the heat-insulating layer.

The gas is discharged from the treatment chamber through a high-pressure gas discharging passage 113 formed in the upper lid 105. The gas within the treatment chamber is guided into the high-pressure gas discharging hole 113 via a gas passage formed between the outer surface of the heat-insulating layer 108 and the cylindrical body 104.

Under the wafers 102 is a heater 115 of resistance heating type, which provides heat for high-temperature, high-pressure annealing. The heater 115 is fixed to the lower lid 106 through a support member 116, and is radially divided into two zones (heating elements 115a and 115b). By effecting independent temperature control over these heating elements 115a and 115b, a uniform heat distribution can be achieved in the radial direction.

A space between the heat-insulating layer 108 and the products 102 to be treated has the function of preventing occurrence of vertically non-uniform temperature distribution in the treatment chamber by controlling natural convection resulting from the high-temperature, high-pressure gas. Specifically, a uniform heat distribution is achieved by utilizing the following phenomenon.

A treatment medium gas, such as high-temperature and high-pressure argon gas, has high density and low viscosity, and natural convection results from such a gas very easily. The gas heated in the lower region rises quickly to heat the products 102 to be treated. However, due to the inverted cup-like shape of the heat-insulating layer 108, the hot gas stays in the upper region of the space formed by the heat-insulating layer 108, and this tends to bring about a non-uniform temperature distribution in which the temperature is high in the upper region and low in the lower region.

Such phenomenon of the gas is promoted by heat radiation particularly from the inner surface of the cylindrical sidewall portion of the heat-insulating layer 108 to the outside.

In this embodiment, to prevent this phenomenon, a soaking cylindrical member (convection current passage forming member) 117 having openings at both top and bottom ends thereof is disposed between the products 102 to be treated and the heat-insulating layer 108 (within the treatment chamber). This cylindrical member 117 is constructed so that the member 117 surrounds the treated products 102 from their side while extending from the uppermost one 102 to the lowermost one 102.

The soaking cylindrical member 117 has the function of converting natural convection currents of the gas into an upflow in the inside thereof and a downflow in the outside thereof. The heat from the heater 115 is first applied to the products 102 to be treated, and then maintains the temperature within the treatment chamber while compensating for the heat radiated to the outside from the inner surface of the heat-insulating layer 108.

From a different point of view, a space inside the soaking cylindrical member 117 constitutes a first passage S1 for the upflow and a space outside thereof a second passage S2 for the downflow, and thus it can be said that a vertically circulating convection is occurring between the first and second passages S1 and S2.

Figure 14:
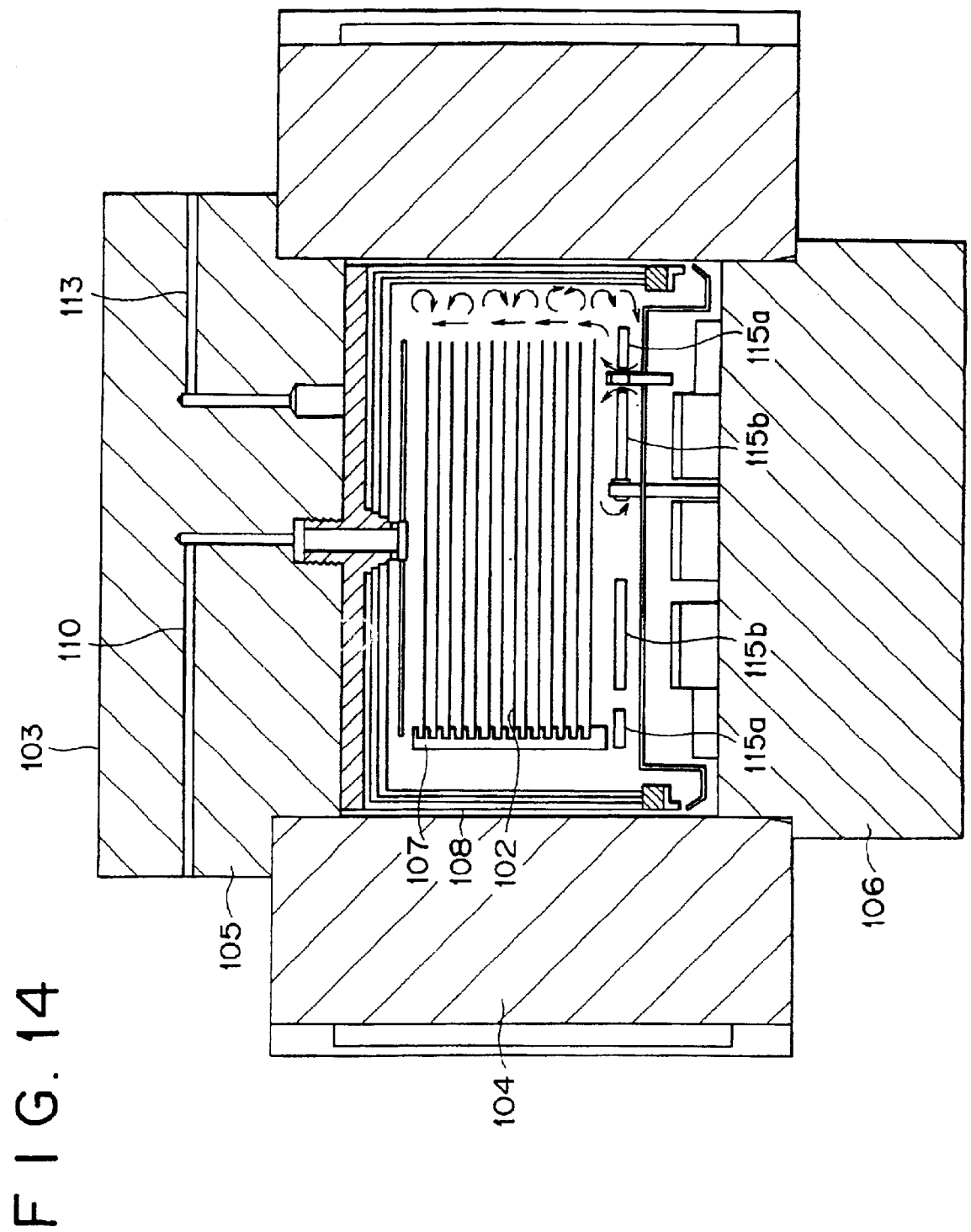
FIG. 14 is a sectional view showing the interior of a high-temperature and high-pressure treatment device which is a comparative example with respect to the second embodiment.

FIG. 14 shows how the gas flows with no soaking cylindrical member 117 as an example (equivalent to the first embodiment) to be compared with the second embodiment. It shows a localized natural convection, which tends to make the upper region hot. Note that with the structure shown in FIG. 14, a non-uniform temperature distribution tends to occur easily also in the radial direction, but with the structure shown in FIG. 13, the temperature distribution tends to become more uniform in both vertical and radial directions.

A comparison was made between the structure shown in FIG. 13 and the comparative structure shown in FIG. 14 to see how temperature was distributed when thirteen 8 inches wafers were contained. At a control temperature of 450° C. (at the center in the vertical direction), a temperature difference of 15° C. was observed between the upper and lower regions of the comparative structure shown in FIG. 14, while the temperature difference was 3° C. in the structure of this embodiment. Since the allowable temperature difference is specified to be within ±5° C. in a regular heat treatment given to Si wafers, the structure according to this embodiment can satisfy such temperature difference specifications satisfactorily.

The shape and arrangement of the soaking cylindrical member 117 is not particularly limited to the one shown in FIG. 13 as long as the member can perform the above-mentioned functions. It is preferable, however, that the cylindrical member 117 surround the whole group of treated products 102 and allow the side surface of the heater to be contained therein. The soaking cylindrical member 117 is open vertically, i.e., its upper and lower ends must be open so that streams of gas are formed from the outside to the inside thereof or vice versa.

However, the upper and lower openings for forming the above streams are not necessarily provided at the top and bottom ends of the cylindrical member 117 as shown in FIG. 13, but these openings may be formed at the upper and lower positions in the side surface of the cylindrical member 117. For example, the lower end of the cylindrical member 117 is extended as far as to the position near the lower lid 106, and an opening is formed in a lower region of such cylindrical member 117 coinciding with the side portion of the heater 115 so that the high-temperature and high-pressure gas coming down through the space outside the cylindrical member 117 can be guided toward the heater 115. This construction is also included in the embodiments of the present invention.

Figure 15:
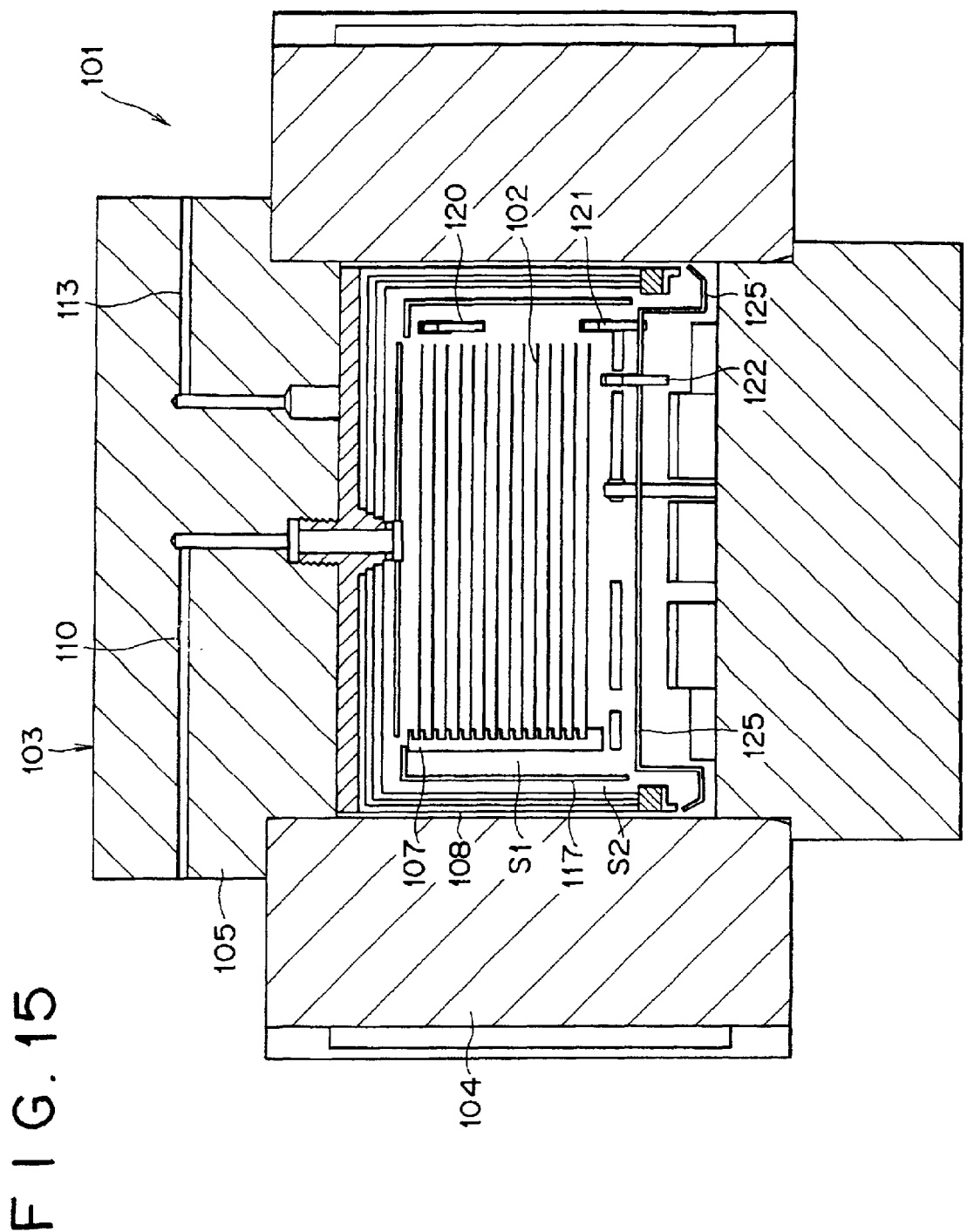
FIG. 15 is an internal sectional view chiefly showing the arrangement of temperature measuring means.

Further, while the cylindrical member 117 may have a simple cylindrical form such as shown in FIG. 13, it may also have a structure such as shown in FIG. 15 in which the upper opening is narrowed so that its cross section is reduced, depending on the degree to which heat is released above the heat-insulating layer 108.

Still further, from another point of view, the soaking means is not necessarily limited to the cylindrical member 117. Any means would be acceptable as long as it includes the first passage S1 for the upflow and the second passage S2 for the downflow.

The heater 115 for heating the treated products 102 and the treated products 102 themselves are fixed on the lower lid 106, and the Si wafers, which are the treated products 102, are put in and taken out by elevating the lower lid 106. Although the soaking cylindrical member 117 could be fixed to the lower lid 106, it is recommended that the member 117 be suspended from the inner surface of the heat-insulating layer 108 as described above for the following reason. Due to the fact that Si wafers are usually transferred in the horizontal direction from sideward using a robot or the like during their handling, if the soaking cylindrical member 117 were fixed to the lower lid 106, the member 117 would have to be removed from the lid 106 every time the wafer transfer operation is performed.

Further, to monitor the temperature distribution within the treatment chamber, it is recommended that temperature measuring means 120 and 121, such as thermocouples, be disposed at positions near the upper and lower treated products 102 within the soaking cylindrical member 117 (see FIG. 15). In a regular high-temperature and high-pressure operation, a soaking condition that is substantially equal to the aforementioned can be obtained at a high pressure of 30 MPa or higher. However, to guarantee a specified temperature history of the treated products 102, it is important to monitor the temperature throughout the process. When it is required to heat the treated products 102 under low pressure, it is recommended that heating speed and the like be controlled while monitoring the vertical temperature distribution. Note that large power is sometimes supplied to the heater 115 for quick heating. In such a case, to prevent the heater 115 from overheating, it is recommended that separate temperature measuring means 122 is disposed near the heater so that the temperature near the heater is measured (see FIG. 15).

In the high-temperature and high-pressure gas annealing device 101 for semiconductor substrates according to this embodiment, adhesion of particles to Si wafers is the problem to be overcome next to the temperature distribution problem. Particles are formed by oxidation of furnace forming members, such as heat-insulating structures, and by friction and vibration between components. In the case of fine, light particles, which have become increasingly easily floatable due to increased buoyancy of the high-density and high-pressure gas, are carried to spaces between the treated products by natural convection of the gas. To prevent this, it is recommended to take the following measures.

First of all, these particles often tend to come to the lower inner region of the vessel, or more straightforwardly, they tend to deposit on the lower lid. Thus, one measure is to dispose a shielding plate (shielding member) 125 lest a downflow in the natural convection outside the soaking cylindrical member 117 should reach the upper surface of the lower lid 106. The shielding plate 125 is disposed between the soaking cylindrical member 117 and the lower lid 106 (to the lower inner surface of the pressure vessel 103). In other words, its form is such as shown in FIG. 13, whereby the first and second passages S1 and S2 are formed so as to be remote from the upper surface of the lower lid 106 while divided by the shielding plate 125.

Further, when the heater 115 is AC-powered and if its heating elements are constructed of bands or wires, vibrations occur to cause friction between themselves and the electric insulators fixing them, and hence particles are formed. Thus, it is recommended to use a DC-powered heater.

A felt-like heat-insulating material is usually used as the heat-insulating layer 108. However, felt-like heat-insulating materials are usually made from ceramic fibers, and they embrittle due to their being repetitively subjected to temperature cycles and thus form particles. To prevent this and to obtain satisfactory heat-insulating performance on a practical level, the most suitable construction would be such that a plurality of inverted cup-like metallic heat-shielding members are layered at predetermined intervals as shown in FIG. 13. For a treatment temperature up to about 500° C., a heat-insulating layer of three to five inverted cup-like heat-shielding members made from an austenitic stainless steel, such as a SUS 304 steel, can provide a practically satisfactory level of performance. It is recommended that these members be layered at intervals of 2 to 3 mm lest they should rub each other and play.

Note that the heat-insulating layer 108 is not limited to the above-mentioned structure as long as the layer can provide heat insulation.

Further, to suppress the formation of particles due to oxidation of the heating elements, it is effective to give the furnace forming members a surface smoothing treatment, such as an electropolishing treatment so that the asperities on their surfaces can be reduced. Why such a treatment is effective is because oxidation occurs noticeably at pointed parts and these parts easily flake and come off when oxidized.

According to the above-described embodiment, the inner diameter of the high-pressure vessel 103 is merely 300 mm or so in contrast to 350 to 400 mm required of a conventional HIP device for 8 inches wafers. That is, a 30–40% reduction in pressure receiving area is possible, and this is very effective to reduce the dimensions as well as the weight of the pressure vessel. Further, the consumption of the pressure medium gas required for the treatment can be reduced in the same proportion, and this is also very effective to improve the treatment cost. Note that other part of the construction of the second embodiment whose description is omitted is similar to that of the first embodiment.

Figure 16:
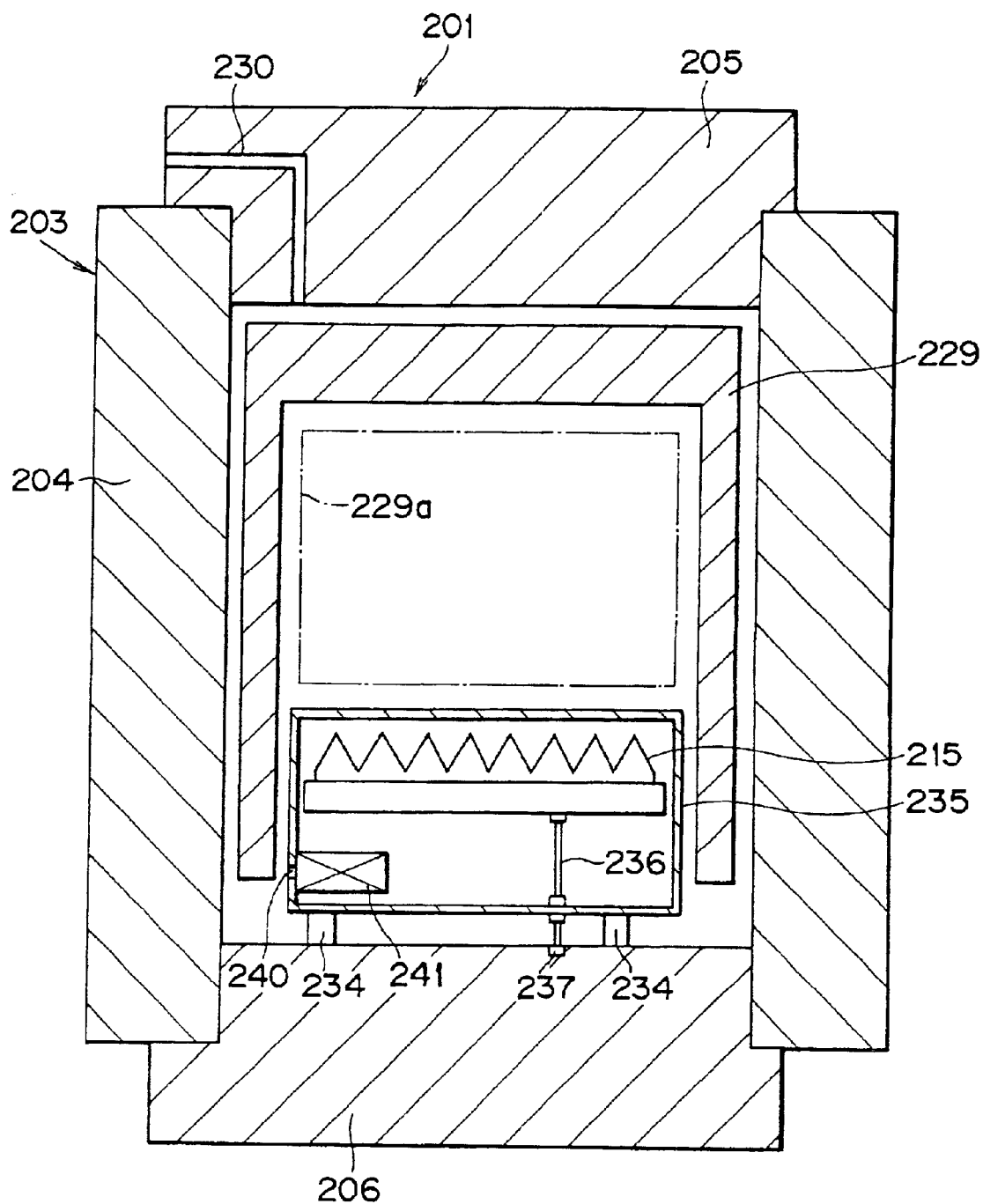
FIG. 16 is a sectional view showing the interior of a high-temperature and high-pressure treatment device according to a third embodiment.

FIG. 16 shows a high-temperature and high-pressure treatment device 201 for semiconductors according to the third embodiment of the present invention. The device 201 has a pressure vessel 203 for storing semiconductor (Si) wafers. The pressure vessel 203 includes a cylindrical body 204 having openings at both top and bottom ends thereof, an upper lid 205 for closing the upper opening of the cylindrical body 204, and a lower lid 206 for closing the lower opening of the cylindrical body 204. The upper and lower lids 205 and 206 are detachably attached to the cylindrical body 204, and the semiconductors are put in and out of the vessel by opening the lower lid 206. Note that the upper lid 205 may be of one-piece structure with the cylindrical body 204.

A space defined by the cylindrical body 204, the upper and lower lids 205 and 206 is a high-pressure chamber in which a high-pressure atmosphere is achieved. An inverted cup-like heat-insulating layer 229 having an opening at its lower end is disposed within this high-pressure chamber. Within the high-pressure chamber, a treatment chamber 229a for storing semiconductors is defined by the space inside the heat-insulating layer 229. Although not shown, a plurality of wafers, which are the products to be treated, are piled up at predetermined intervals on a boat in the treatment chambers 229a. This step is usually carried out by a clean robot.

A gas introducing and discharging passage 230 is formed in the upper lid 205 so that a gas supplied from outside is introduced into and discharged from the pressure vessel 203. To treat semiconductors under high pressure, a high-pressure gas is supplied from a gas compressor (not shown) via the gas introducing and discharging passage 230. An inert gas, such as argon gas, is used. Further, when the treatment has been completed, the high-pressure gas is discharged via the passage 230 and either recovered to a gas holder (not shown) after evacuated by a pressure reducing valve or released into atmosphere.

An airtight casing 235 is disposed on the upper surface (the inner surface) of the lower lid 206 through support members 234. Note that the support members 234 may be dispensed with. The airtight casing 235 is made from a less gas-permeable material, such as stainless steel or quarts, and is made airtight excluding a gas passage 240, which will be described later.

A heater 215 for heating the treatment chamber 229a is disposed within the airtight casing 235. Generally, a heater 215 of resistance heating type may be used. The airtight casing 235 is located in the lower region of the treatment chamber 229a defined by the heat-insulating layer 229. The heater 215 is thus located under the semiconductors that are contained in the treatment chamber 229a. When the heater 215 is located in the lower region of the treatment chamber 229a in this way, the inner diameter of the cylindrical body 204 can be minimized, and hence the device can be made more compact in structure and lighter in weight. That is, the heater could be disposed beside the treatment chamber, but in this case, the inner diameter of the cylindrical body 204 would be too large relative to the required size of the treatment chamber. On the other hand, when the heater is located in the lower region of the treatment chamber, there is no need to increase the inner diameter of the body 204, and thus the device can be made more compact in structure and lighter in weight.

Electric wiring for supplying the heater 215 with electricity is provided by connecting a cable 236, which extends outside the casing 235 from the heater 215, to an electrode 237 disposed in the lower lid 206. Power is fed to the electrode 237 from a power source outside the pressure vessel 203. The casing 235 is electrically insulated from the cable 236, and is also provided with a seal member for keeping the passage of the cable 236 airtight.

The gas passage (first gas passage) 240 is formed in the airtight casing 235 so that spaces inside and outside the casing 235 can communicate with each other. Further, a filter 241 for entrapping particles is attached to the passage 240 within the airtight casing 235, so that the gas flowing out of the casing 235 passes through the filter 241 without fail. A filter 241 capable of removing particles of as fine as 0.1 $\mu$m preferable. A plurality of first gas passages 240 maybe provided. In such a case, it is required that the gas circulating the respective passages 240 go through a filter or filters.

Next, the actual treatment using the device 201 will be described. First, outside the cylindrical body 204, semiconductor wafers, which are the products to be treated, are piled up on the boat that is arranged on the airtight casing 235. This operation is usually performed by a clean robot. Then, the lower lid 206 and the casing 235 with the wafers placed thereon are lifted up into the cylindrical body 204 by a handling unit (not shown).

Successively, the pressure vessel 203 is once evacuated, and the residual air therewithin is driven out. After the evacuation, the step of introducing argon gas whose pressure ranges from a few to ten-odd atmospheres into the vessel and driving out the air therefrom is repeated to obtain an atmosphere of argon inside the pressure vessel.

Then, the high-pressure chamber is pressurized by supplying the argon gas via the gas introducing and discharging passage 230 by the compressor, and the heater 215 is supplied with power to heat the chamber. Then, the semiconductors are treated while the treatment chamber is maintained under predetermined conditions (for example, 380° C.×120 MPa) for a predetermined period of time. During treatment, the gas flows also into the casing 235 via the first gas passage 240, thereby reducing pressure differences between the spaces inside and outside the casing 235, and hence preventing the casing 235 from being damaged. Further, the gas exiting from the casing 235 is free of particles owing to the filter 241, thereby preventing particles from coming out of the casing 235.

After the treatment, the heater 215 is disenergized and the chamber is cooled. Then, the argon gas within the high-pressure chamber is discharged via the passage 230, thereby evacuating the chamber. After the chamber is brought to atmospheric pressure by discharging the argon gas therefrom, the treated wafers are taken out by opening the lower lid 206.

While FIG. 16 shows an example in which the heater 215 is disposed only in the lower region of the treatment chamber 229a, it should be noted that another heater 215 may be disposed around the treatment chamber 229a if the chamber must be operated under a wide range of temperatures and pressures. In such a case, an airtight wall (airtight casing) is interposed between the treatment chamber and the heater disposed around the treatment chamber lest particles coming from the heater should enter the treatment chamber by allowing the airtight wall to substitute for the airtight casing 235 shown in FIG. 16. In this case, the airtight wall should be provided with the first gas passage 240 and the filter 241. Note that other part of the construction of the third embodiment whose description is omitted is similar to that of the first or second embodiment.

Figure 17:
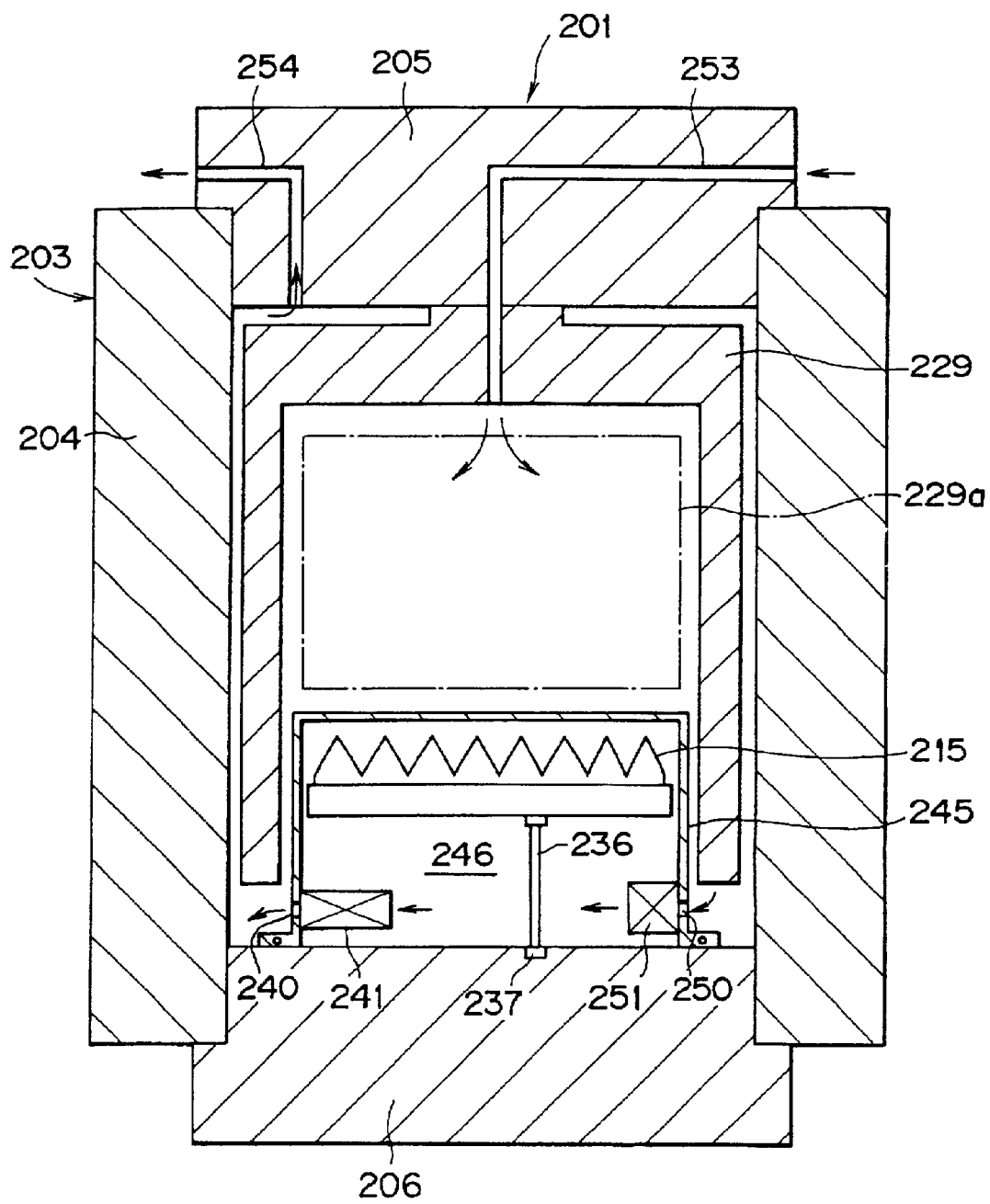
FIG. 17 is a sectional view showing the interior of a high-temperature and high-pressure treatment device according to a fourth embodiment.

FIG. 17 shows a fourth embodiment of the present invention. While it is the casing 235 alone that encloses the heater 215 in the third embodiment, a casing 245 in the fourth embodiment encloses a heater 215 in cooperation with the inner surface of a pressure vessel 204. That is, the airtight casing 245 of FIG. 17 has a coupling opening 246 at its lower end, and this opening is coupled with the lower lid 206 around its outer edge. The casing 245 and the lower lid 206 are coupled with each other airtight with a seal member, and the casing 245 and the upper surface of the lower lid 206 enclose the heater 215. The airtight casing of the present invention includes this mode as well.

An electrode 237 for supplying power to the heater 215 is located at such a position of the lower lid 206 as to allow the lid 206 to enclose the heater 215. With this arrangement, it is not necessary to extend a cable 236, which connects the heater 215 to the electrode 237, outside the casing 245, and thus the device of FIG. 17 can be simpler in structure and easier in maintenance than the device of FIG. 16.

The casing 245 not only has a first gas passage 240 and a filter 241, but also an additional second gas passage 250. A reverse flow preventing unit 251 is disposed at the second gas passage 250 so that argon gas is allowed to flow only into the casing 245, but not vice versa. Due to its lower air-flow resistance than the filter 241, the reverse flow preventing unit 251 admits the gas into the casing 245 quickly via the second passage 250, and then the filter 241 and the first passage 240 cause the gas to flow out of the casing 245 while preventing particles from going out together.

Further, in the fourth embodiment, a gas introducing passage 253 and a gas discharging passage 254 are formed in the upper lid 205. When only one of these passages is used for both gas introducing and discharging purposes, such passage may, in some cases, be contaminated with dirty gas during discharging. In such cases, the introducing passage 253 and the discharging passage 254 may be provided separately, whereby clean gas can be supplied.

Further, a heat-insulating layer 229 is fixed at its top to the lower surface of the upper lid 205. This arrangement allows the introducing passage 253 to pass through the layer 229 from the upper lid 205, thereby causing the passage 253 to directly communicate with the treatment chamber and allowing a gas introducing port to be formed in the inner surface of the layer 229. That is, the gas introducing passage is formed so as to reach the inner surface of the heat-insulating layer 229 so that the gas is directly supplied to the treatment chamber 229a. Therefore, the cleanest argon gas that is to be supplied from outside first enters the treatment chamber, then, after treatment, passes through the space between the heat-insulating layer 229 and the pressure vessel 203 (cylindrical body 204) from below the heat-insulating layer 229, and is finally discharged out of the high-pressure vessel via the gas discharging passage 254. Other part of the construction of the fourth embodiment whose description is omitted is similar to that of the third embodiment.

Note that the foregoing examples and embodiments are to be considered as illustrative and not restrictive. The scope of the present invention is defined by the appended claims, and all modifications that fall within the bounds of the claims, or equivalence of such bounds are, therefore, intended to be embraced by the invention.

What is claimed is:

1. A high-temperature and a high-pressure treatment device for treating semiconductor wafers in an atmosphere of high-temperature and high-pressure gas, comprising:

a pressure vessel;

a treatment chamber for treating a plurality of stacked semiconductor wafers within the pressure vessel;

a heater disposed within the treatment chamber so as to be located under the plurality of stacked semiconductor wafers, said heater comprising the only heating device in the pressure vessel, whereby the natural convection of the rising heat from said heater contributes to a substantially uniform temperature within said pressure vessel; and a convection current passage forming member for forming a first passage and a second passage within the treatment chamber, the first passage having the semiconductor wafers therewithin and passing an upflow resulting from heating by the heater, the second passage communicating with the first passage at upper and lower regions of the treatment chamber and causing circulating convection currents to be formed between the first passage and itself by a downflow passing therethrough.

2. A high-temperature and high-pressure treatment device according to claim 1, wherein temperature measuring means is disposed at the first passage.

3. A high-temperature and high-pressure treatment device according to claim 1, wherein the convection current passage forming member is a soaking cylindrical member which has openings at upper and lower portions thereof and which is disposed so as to surround a plurality of stacked semiconductor wafers, and a space inside the cylindrical member serves as the first passage, and a space outside the cylindrical member serves as the second passage.

4. A high-temperature and high-pressure treatment device according to claim 3, wherein a shielding member is disposed between the cylindrical member and a lower inner surface of the pressure vessel.

5. The high-temperature and high-pressure treatment device of claim 1, wherein the pressure vessel incorporates heat insulating material.

6. The high-temperature and high-pressure treatment device of claim 1, wherein the pressure vessel holds a pressure of at least 70 MPa.

* * * * *

UNITED STATES PATENT AND TRADEMARK OFFICE
CERTIFICATE OF CORRECTION

PATENT NO. : 6,733,592 B2
DATED : May 11, 2004
INVENTOR(S) : Fujikawa et al.

It is certified that error appears in the above-identified patent and that said Letters Patent is hereby corrected as shown below:

<u>Title page,</u>
Item [73], Assignee, should read:
-- [73] Assignee: Kabushiki Kaisha Kobe Seiko Sho (Kobe Steel, Ltd.), Kobe (JP) --

Signed and Sealed this

Twenty-third Day of November, 2004

JON W. DUDAS
*Director of the United States Patent and Trademark Office*